(12) United States Patent
Ke

(10) Patent No.: US 7,298,810 B2
(45) Date of Patent: Nov. 20, 2007

(54) MULTI-MODULUS PROGRAMMABLE FREQUENCY DIVIDER

(75) Inventor: Ling-Wei Ke, Hsin-Chu Hsien (TW)

(73) Assignee: Mediatek Incorporation, Science-Based Industrial Park, Hsin-Chu, Hsien (TW)

( * ) Notice: Subject to any disclaimer, the term of this patent is extended or adjusted under 35 U.S.C. 154(b) by 0 days.

(21) Appl. No.: 10/711,410

(22) Filed: Sep. 16, 2004

(65) Prior Publication Data

US 2005/0058236 A1   Mar. 17, 2005

(30) Foreign Application Priority Data

Sep. 17, 2003   (IT)   .............................. 92125672 A

(51) Int. Cl.
*H03K 21/00*   (2006.01)
(52) U.S. Cl. .......................................... 377/48; 377/47
(58) Field of Classification Search ................ None
See application file for complete search history.

(56) References Cited

U.S. PATENT DOCUMENTS

| 4,741,004 | A | * | 4/1988 | Kane | .......................... 377/110 |
| 5,065,415 | A | | 11/1991 | Yamashita | |
| 5,349,622 | A | | 9/1994 | Gorisse | |
| 5,614,869 | A | * | 3/1997 | Bland | .......................... 331/1 A |
| 5,948,046 | A | * | 9/1999 | Hagberg | ...................... 708/103 |
| 6,760,397 | B2 | * | 7/2004 | Wu et al. | ...................... 377/47 |
| 2003/0095621 | A1 | * | 5/2003 | Wu et al. | .................... 377/118 |

FOREIGN PATENT DOCUMENTS

WO    WO 03/043193 A1    5/2003

\* cited by examiner

*Primary Examiner*—Cassandra Cox
(74) *Attorney, Agent, or Firm*—Winston Hsu

(57) ABSTRACT

A programmable frequency divider for dividing the frequency of a source signal according to a selectable divisor which is obtained based on a plurality of divisor signals and outputting a result signal having a divided frequency includes at least one cell of a first type. The cells of the first type are cascaded with each other. The programmable frequency divider synchronously resets all of the cells of the first type according to a reset signal in order to selectively switch each cell of the first type to perform a divide-by-two or divide-by-three operation according to a corresponding divisor signal. The last cell of the first type outputs the result signal having the divided frequency.

48 Claims, 20 Drawing Sheets

MULTI-MODULUS PROGRAMMABLE FREQUENCY DIVIDER

BACKGROUND

The present invention relates to a frequency divider, and more particularly, to a programmable frequency divider.

A frequency divider is a very important component of a frequency synthesizer and is used for dividing a source signal to form a result signal. The frequency of the result signal is the frequency of the source signal being divided with a divisor. As is known in the art, a conventional frequency divider is composed of a plurality of cascaded dual mode dividing cells. Each cell of the frequency divider performs a dividing operation according a corresponding divisor signal. The division range depends on the number of cells of the frequency divider. The more cells that are used, the wider the division range. A ⅔ cell having two dividing modes, which are divide-by-two and divide-by-three modes, is a commonly used dividing cell. If the frequency divider is composed of N ⅔ cells, the division range of the frequency divider is all integers from $2^N$ to $2^{N+1}-1$.

Employing more cells in the frequency divider can extend the division range; however, it deteriorates space efficiency for IC design. U.S. Pat. No. 5,349,622 discloses a programmable frequency divider with a prescaler and a programmable counter. Adjusting the counter value of the programmable counter extends the division range of the frequency divider. The complexity of circuit design and cost, however, are increased due to the utilization of the programmable counter.

In other applications, such as a fractional frequency divider in a frequency synthesizer, the programmed divisor repeatedly changes from a value of M to a value of M+1, then back to M in order to obtain a result signal at a fractional frequency. However, if the divisor changes, i.e. a set of divisor signals are loaded while one or more of the dividing cells is sensitive to the divisor signal, the cells sensitive to the divisor signals are enabled to perform divide-by-two or divide-by-three operations according to the corresponding divisor signals. Therefore, some cells of the programmable frequency divider operate depending upon the divisor signals and the other cells operate depending upon the original divisor signals. The effective division may thereby result an incorrect value, i.e. the effective division may be a value that is neither M nor M+1.

SUMMARY

It is therefore an objective of the claimed invention to provide a programmable frequency divider to guarantee the correctness of the frequency of the output signal of the programmable frequency divider by resetting dividing cells of the programmable frequency divider.

According to the preferred embodiment of the present invention, a method for changing divisors in a programmable frequency divider is disclosed. Wherein the frequency divider has a plurality of cascaded cells, and the method involves: providing a plurality of divisor signals; selectively switching each of the plurality of cells to a divide-by-two or a divide-by-three mode according to the plurality of divisor signals; and synchronously resetting at least a part of the plurality of cells.

The programmable frequency divider of the present invention synchronously resets the plurality of cells after the divisor is changed so that each cell renews its dividing operation.

In another embodiment of the present invention, the programmable frequency divider further utilizes a reload signal to trigger each cell to synchronously reload a corresponding divisor signal in order to guarantee that each cell performs dividing operations according to the corresponding signal after the divisor is changed. The output signal of the programmable frequency divider can be employed to be the reload signal to simplify circuit design.

In addition, the programmable frequency divider of the present invention is capable of extending the division range by simply utilizing flip-flops and simple logic gates to add a bypass mode to the two-mode dividing cells.

According to a preferred embodiment, the programmable frequency divider of the present invention needs to only synchronously reload each of the cells having bypass mode with a corresponding divisor signal in order to simultaneously extend the division range and guarantee the correctness of the frequency of the frequency-divided signal.

One advantage of the present invention is that the division range is extended by utilizing simple flip-flops and logic gates and without any programmable counter.

Another advantage of the present invention is that the programmable frequency divider is capable of ensuring correctness of the frequency of the output signal by resetting cells.

Yet another advantage is that the cells are modularized according to the present invention, so that the circuit design complexity and cost are thereby reduced.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
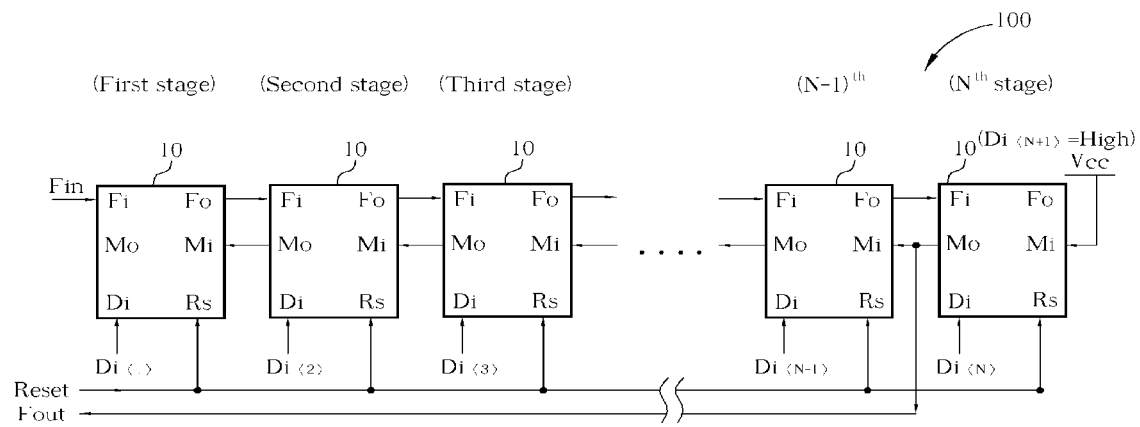
FIG. 1 is a schematic diagram of a programmable frequency divider according to the first embodiment of the present invention.

Please refer to FIG. 1, which depicts a schematic diagram of a programmable frequency divider 100 according to the first embodiment of the present invention. The programmable frequency divider 100 comprises N cascaded dividing cells 10, each cell 10 has a first input node (Fi), a second input node (Mi), a third input node (Di), a fourth input node (Rs), a first output node (Fo), and a second output node (Mo). According to the cascading sequence, those cells 10 of FIG. 1 are respectively defined from left to right as a first stage cell 10, a second stage cell 10, . . . , and an $N^{th}$ stage cell 10.

In the first embodiment of the present invention shown in FIG. 1, from the first stage to the $(N-1)^{th}$ stage, the first output node (Fo) of each cell 10 is coupled to the first input node (Fi) of next stage cell 10 and the second input node (Mi) of each cell 10 is coupled to the second output node (Mo) of next stage cell 10. The second input node (Mi) of the $N^{th}$ stage cell 10 is coupled to a last divisor signal $Di_{<N+1>}$ that is typically a fixed logic value in this embodiment. In the embodiment shown in FIG. 1, the second input node (Mi) of the $N^{th}$ stage cell 10 is coupled to logic 1, (e.g. coupled to Vcc), which means the last divisor signal $Di_{<N+1>}$ is at logic 1. The third input node (Di) of each cell 10 is used for receiving a corresponding divisor signal $Di_{<P>}$, (where $1 \leq P \leq N$). And the fourth input node (Rs) is used for receiving a reset signal to synchronously reset the $P^{th}$ stage cell 10. The reset signal is usually generated from a control circuit (not shown). Each cell 10 operates in a divide-by-two mode or a divide-by-three mode respectively according to the logic level at its third input node (Di). A more detailed operation will be discussed later.

In the first embodiment of the present invention, a source signal Fin is input into the first input node (Fi) of the first stage cell 10 of the programmable frequency divider 100. Each cell 10 processes the source signal Fin according to its dividing mode. After the source signal Fin is sequentially processed by all cells 10, a result signal Fout at a divided frequency is thereby output from the second output node (Mo) or the first output node (Fo) of the $N^{th}$ stage (the last stage) cell 10. A programmable divisor value, which is obtained based on the divisor signals, determines the ratio of the frequency of the result signal Fout to the frequency of the source signal Fin. The programmable divisor value is presented as a set of binary divisor signals, $Di_{<P>}$, $1 \leq P \leq N+1$, and each binary divisor signal $Di_{<P>}$ is loaded to the third input node (Di) of the corresponding $P^{th}$ stage cell 10 for $1 \leq P \leq N$. Once the divisor value changes, the reset signal is employed to reset all cells 10 after each cell 10 receives the new value of the corresponding divisor signal, so that each cell 10 refreshes its dividing operation after being reset.

Thus, the frequency of the result signal Fout output from the programmable frequency divider 100 is thereby guaranteed to be the result of the frequency of the source signal Fin divided with the new divisor value.

Figure 2:
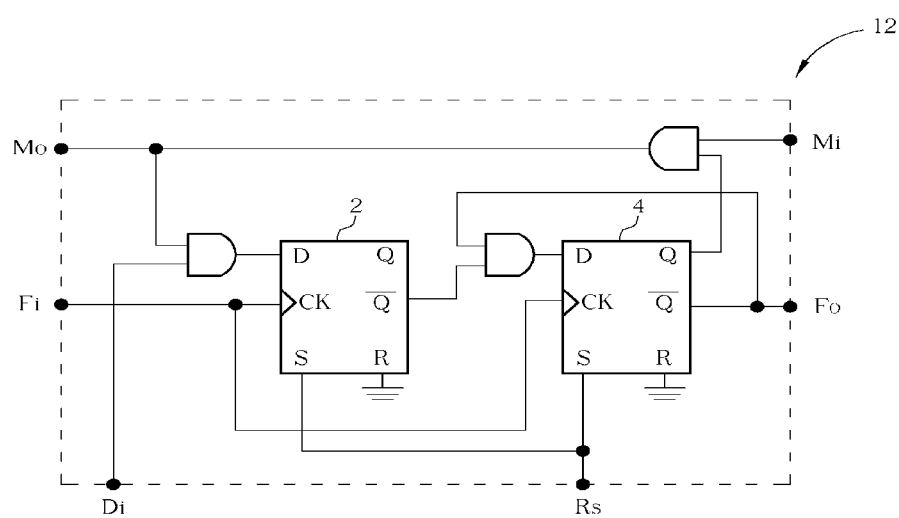
FIG. 2 is a circuit diagram of the cell 10 of FIG. 1.

FIG. 2 depicts a circuit diagram according to one embodiment of the cell 10 of FIG. 1. As shown in FIG. 2, regardless of the logic level of the second input node (Mi), if the first output node (Fo) is at logic 0 and the third input node (Di) is also at logic 0, this makes the cell 10 operate in the divide-by-two mode. In the divided-by-two mode, the positive edge of a clock signal at the first input node (Fi) triggers flip-flops 2 and 4 such that the first output node (Fo) outputs a half frequency signal. In other words, the signal at the first output node (Fo) has a frequency half of that of the clock signal at the first input node (Fi).

If the second input node (Mi) and the third input node (Di) are both at logic 1 and the first output node (Fo) is at logic 0, this makes the cell 10 operate in the divide-by-three mode. In the divided-by-three mode, the positive edge of the clock signal at the first input node (Fi) triggers flip-flops 2 and 4 such that the first output node (Fo) outputs a one-third-frequency signal. In other words, the signal at the first output node (Fo) has a frequency one-third of that of the clock signal at the first input node (Fi).

If the first output node (Fo) is at logic 0, the second output node (Mo) outputs a signal at the same logic level as the second input node (Mi). In addition, regardless of the logic level of the second input node (Mi), if the first output node (Fo) is at logic 1, the second output node (Mo) outputs a logic 0 signal. Furthermore, if the reset signal received on the fourth input node (Rs) is at an active state (i.e. is enabled), such as the logic 1 of the example embodiment, the flip-flops 2 and 4 are both at reset state such that the cell 10 does not perform a dividing operation and the first output node (Fo) outputs a logic 0 signal. Additionally, when the reset signal is enabled, if the second input node (Mi) is at logic 1, the second output node (Mo) outputs a logic 1 signal. After reset is disabled, e.g., the reset signal returns to logic 0 level, the cell 10 renews its dividing operation.

In other words, according to the circuit diagram 12, regardless of the logic level of the second output node (Mo), if the third input node (Di) is at logic 0, this means the cell 10 will operate in the divide-by-two mode. The positive edge of the clock signal at the first input node (Fi) triggers the first output node (Fo) to output the half frequency signal. If the second output node (Mo) and the third input node (Di) are both at logic 1, this means the cell 10 will operate in the divide-by-three mode. The positive edge of the clock signal of the first input node (Fi) triggers the first output node (Fo) to output the one-third-frequency signal.

From the above illustration of the circuit diagram 12, it is known that the operating clock of the cell 10 is the signal received at the first input node (Fi). Regarding to the first stage cell 10 shown in FIG. 1, for example, the operating clock is the source signal Fin received at the first input node (Fi) thereof. In the first embodiment of the present invention, the operating clock of the cells 10 of the programmable frequency divider 100 is sequentially delivered from the first stage to the last stage (the $N^{th}$ stage) and a division cycle is thereby completed.

In addition, the signal received at the second input node (Mi) of a cell 10 acts as an enabling signal which is involved in cell 100 is switching its dividing mode. When the enabling signal loaded on the second input node (Mi) is at an inactive state, for example, logic 0 of the embodiment, the cell 10 operates in the divide-by-two mode. If the enabling signal loaded on the second input node (Mi) is at an active state (such as logic 1), the cell 10 will operate in either the divide-by-two or divide-by-three mode depending upon the division signal loaded on the third input node (Di). For example, when the second input node (Mi) is at the active state and the division signal loaded on the third input node (Di) is logic 1, the cell 10 will operate in the divide-by-three mode. Please refer back to FIG. 1. In the programmable frequency divider 100, the enabling signal is propagated from the $N^{th}$ stage back to the first stage. Since the cell 10 in the previous stage receives the enabling signal with a higher frequency. This design is feasible for the previous stages to operate in high frequency.

Note that an important feature of the programmable frequency divider 100 of the present invention is to synchronously reset all cells 10 thereof. As mentioned above, in the related art, when the divisor of the frequency divider changes, this may result in incorrect division. In the first embodiment of the present invention, when the divisor changes, the programmable frequency divider 100 synchronously resets all cells 10 so that each cell 10 renews its operation according to the new divisor value without sufferring from the problem of the related art.

Figure 3:
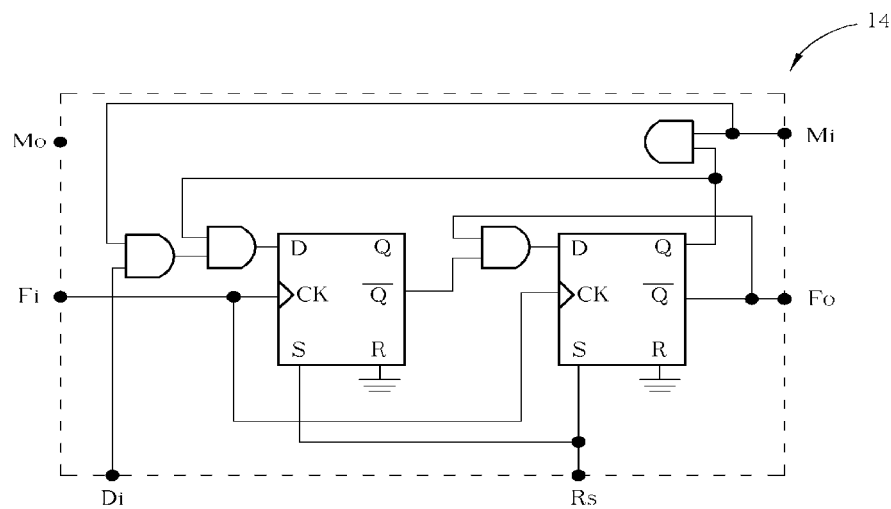
FIG. 3 is another circuit diagram of the cell 10 of FIG. 1.

Please refer to FIG. 3 as well as to FIG. 2. The circuit diagram 14 shown in FIG. 3 is another embodiment of the cell 10. In contrast to FIG. 2, obviously, the difference between the circuit diagram 12 of FIG. 2 and the circuit diagram 14 of FIG. 3 is that one more AND gate is employed in the circuit diagram 14 to improve the output speed of the second output node (Mo). The logical operation of the circuit diagram 14 is substantially the same as the circuit diagram 12 and further details are thereby omitted here.

Figure 4:
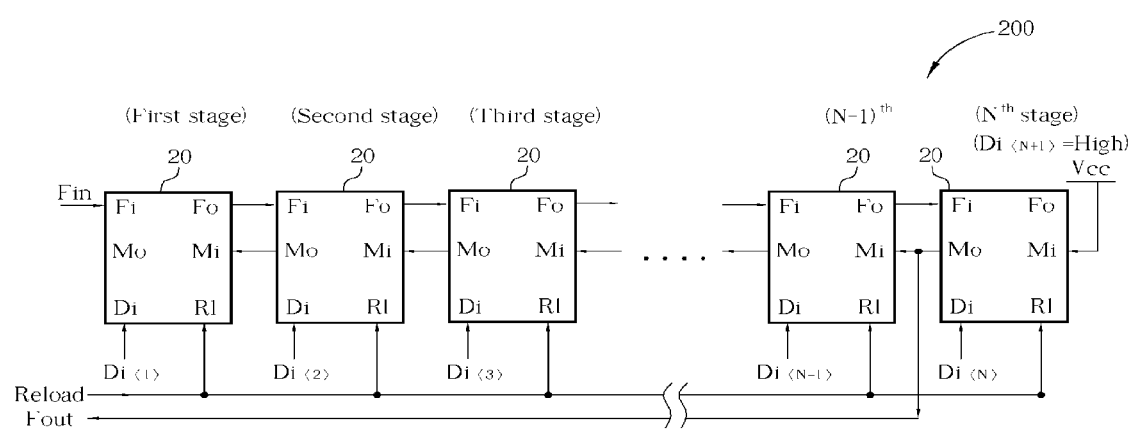
FIG. 4 is a schematic diagram of a programmable frequency divider according to the second embodiment of the present invention.

FIG. 4 depicts a schematic diagram of a programmable frequency divider 200 according to a second embodiment of the present invention. The programmable frequency divider 200 comprises N cascaded dividing cells 20, wherein each cell 20 has a first input node (Fi), a second input node (Mi), a third input node (Di), a fourth input node (Rl), a first output node (Fo), and a second output node (Mo). According to the cascading sequence, the cells 20 of FIG. 4 are respectively defined from left to right as a first stage cell 20, a second stage cell 20, . . . , and an $N^{th}$ stage cell 20.

In the second embodiment of the present invention, from the first stage to the $(N-1)^{th}$ stage of the programmable frequency divider 200, the first output node (Fo) of each cell 20 is coupled to the first input node (Fi) of a next stage and the second input node (Mi) of each cell 20 is coupled to the second output node (Mo) of a next stage. The second input node (Mi) of the $N^{th}$ stage cell 20 is coupled to a last divisor signal $Di_{<N+1>}$ that is typically a fixed logic level, such as Vcc shown in FIG. 4. The third input node (Di) of each cells 20 is used for receiving a corresponding divisor signal $Di_{<P>}$, (where $1 \leq P \leq N$). And the fourth input node (Rl) is used for receiving a reload signal to synchronously reload the $P^{th}$ stage cell 20. The reload signal is usually generated from a control circuit (not shown). When the reload signal triggers the cells 20, a corresponding divisor signal $Di_{<P>}$, on the third input node (Di) is synchronously reloaded into the $P^{th}$ stage cell 20. And each cell 20 then switches its operation into the divide-by-two or the divide-by-three mode depending upon the loaded divisor signal.

In the second embodiment of the present invention, a source signal Fin is input into the first input node (Fi) of the first cell 20 of the programmable frequency divider 200. Each cell 20 then processes the source signal Fin depending upon its operation mode in sequence. Afterward, a result signal Fout at a divided frequency is then output from the second output node (Mo) or the first output node (Fo) of the cell 20 in the $N^{th}$ stage (i.e., the last stage). The ratio of the frequency of the result signal Fout to the frequency of the source signal Fin is configured by a set of programmable divisor signals that are synchronously loaded on the third input node (Di) of each cell 20 respectively. When changing the divisor, a divisor is presented as a set of binary divisor signals that are received on the third input node (Di) of each cell 20 respectively. At this moment, each cell 20 has not yet loaded the divisor signal. After a reload signal is loaded on the fourth input node (Rl) of each cell 20, each cell 20 synchronously loads the corresponding divisor signal on its third input node (Di). Thus, the frequency of the result signal Fout is thereby guaranteed to be the result of the frequency of the source signal Fin divided by the divisor.

Figure 5:
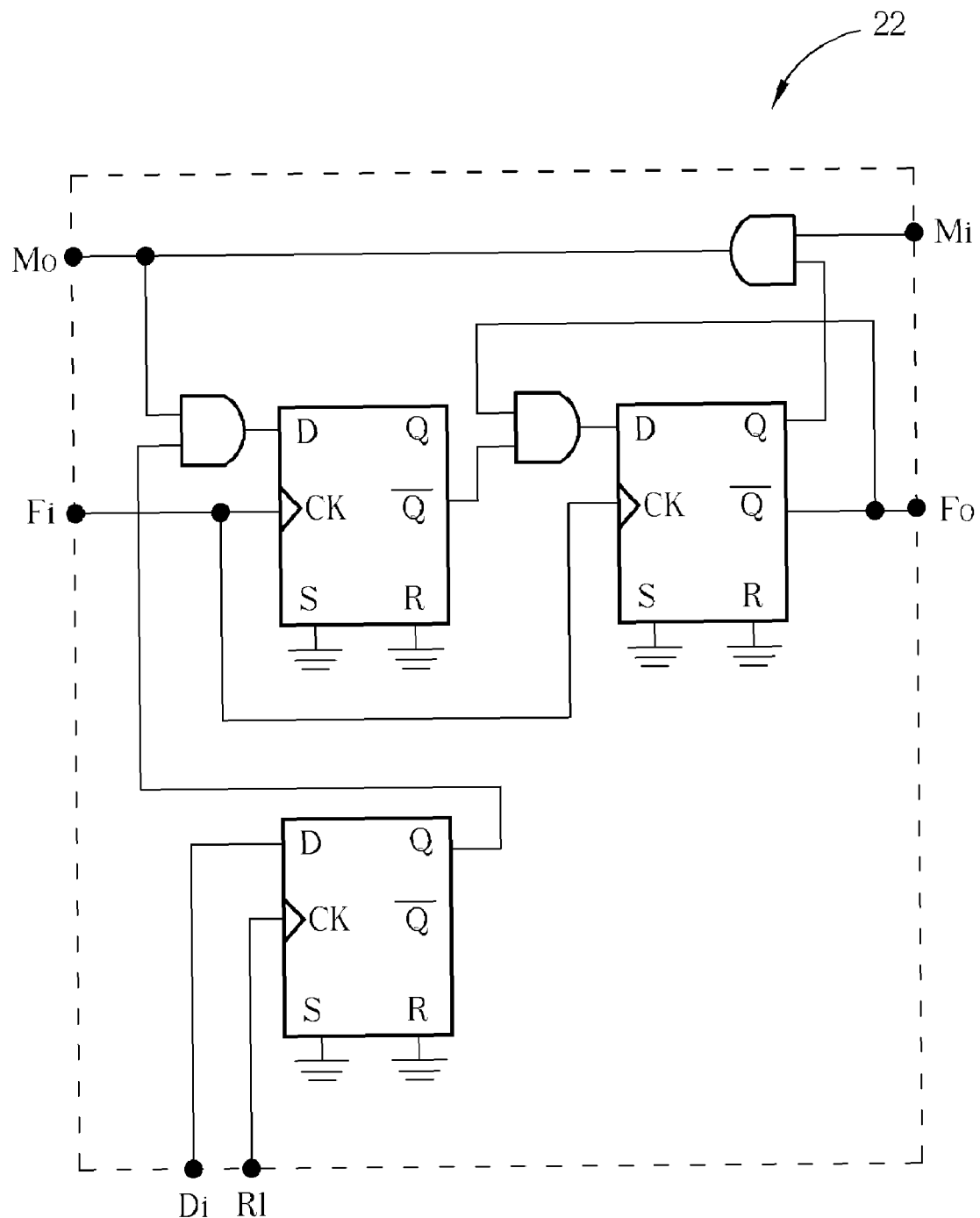
FIG. 5 is a circuit diagram of the cell 20 of FIG. 4.

Please refer to FIG. 5, which depicts a circuit diagram 22 according to one embodiment of the cell 20 of FIG. 4. As can be seen from the circuit diagram 22, regardless of the logic level of the second input node (Mi) is logic 0 or logic 1, if the first output node (Fo) is at logic 0, and the third input node (Di) is at logic 0 when the fourth input node (Rl) is triggered by the reload signal, the cell 20 will perform a divide-by-two operation. In the divide-by-two operation, the positive edge of a clock signal at the first input node (Fi) triggers the first output node (Fo) to output a half frequency signal. On the other hand, if the second input node (Mi) is at logic 1, the first output node (Fo) is at logic 0, and the third input node (Di) is at logic 1 when the fourth input node (Rl) is triggered by the reload signal, the cell 20 will perform a divide-by-three operation. In the divide-by-three operation, the positive edge of the clock signal of the first input node (Fi) triggers the first output node (Fo) to output a one-third-frequency signal.

In addition, if the first output node (Fo) is at logic 0, the second output node (Mo) outputs a signal at the same logic level as the second input node (Mi). Furthermore, regardless of the logic level of the second input node (Mi), if the first output node (Fo) is at logic 1, the second output node (Mo) outputs a logic 0 signal.

In other words, regardless of the logic level of the second output node (Mo) is logic 0 or logic 1, if the third input node (Di) is at logic 0 when the fourth input node (Rl) is triggered by the reload signal, this means the cell 20 will operate in a divide-by-two mode. The positive edge of the clock signal of the first input node (Fi) triggers the first output node (Fo) to output a half frequency signal. In addition, if the second output node (Mo) is at logic 1 and the third input node (Di) is at logic 1 when the fourth input node (Rl) is triggered by the reload signal, the cell 20 will operate in a divide-by-three mode. The positive edge of a clock signal of the first input node (Fi) triggers the first output node (Fo) to output a one-third-frequency signal.

In the second embodiment of the programmable frequency divider of the present invention, the operating clock of the cells 20 is the signal received at the first input node (Fi). The operating clock of each cell 20 of the programmable frequency divider 200 is sequentially delivered from the first stage to the last stage (the $N^{th}$ stage) so that the programmable frequency divider 200 completes a whole division cycle.

Similarly, the signal received on the second input node (Mi) of each cell 20 acts as an enabling signal which is involved in cell 20's switching its dividing mode. In the programmable frequency divider 200, the enabling signal propagates from the $N^{th}$ stage back to the first stage. Since the cell 20 at the previous stage receives the enabling signal with higher frequency, this design supports the previous stages to operate in high frequency.

In contrast with the first embodiment shown in FIG. 1, a reload signal is employed in the programmable frequency divider 200 of FIG. 4 to trigger each cell 20. Each cell 20 synchronously reloads a corresponding divisor signal when triggered by the reload signal and then operates according to the newly loaded divisor signal. Accordingly, the division result of the programmable frequency divider 200 after the divisor is changed is thereby guaranteed without suffering from the problem in the related art.

Figure 6:
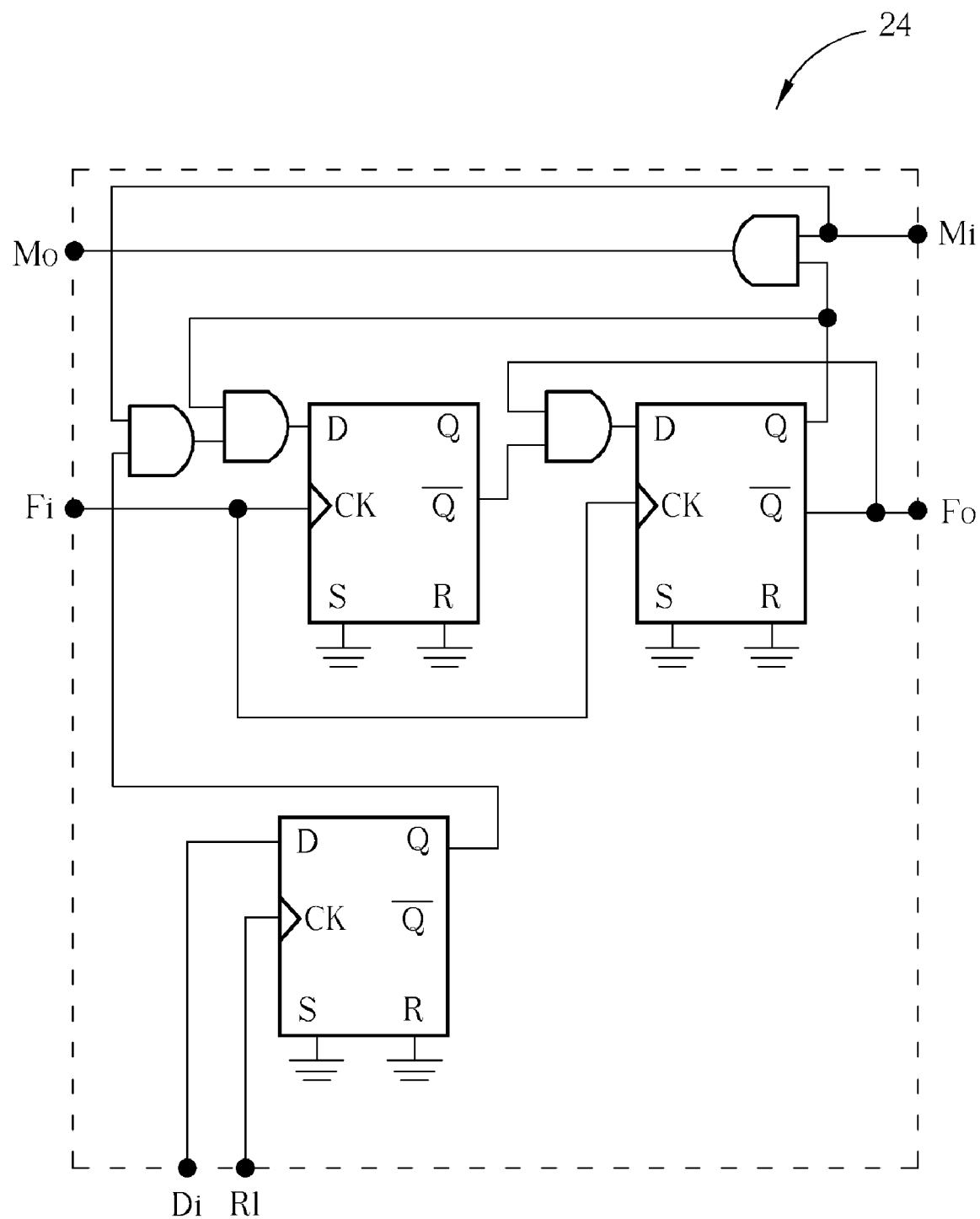
FIG. 6 is another circuit diagram of the cell 20 of FIG. 4.

Please refer to FIG. 6 as well as to FIG. 5. The circuit diagram 24 shown in FIG. 6 is another embodiment of the cell 20 of FIG. 4. In contrast to FIG. 5, the difference between the circuit diagram 22 of FIG. 5 and the circuit diagram 24 of FIG. 6 is that one more AND gate is employed in the circuit diagram 24 to improve the output speed of the second output node (Mo). The logical operation of the circuit diagram 24 is substantially the same as the circuit diagram 22 and further details are thereby omitted here.

Figure 7:
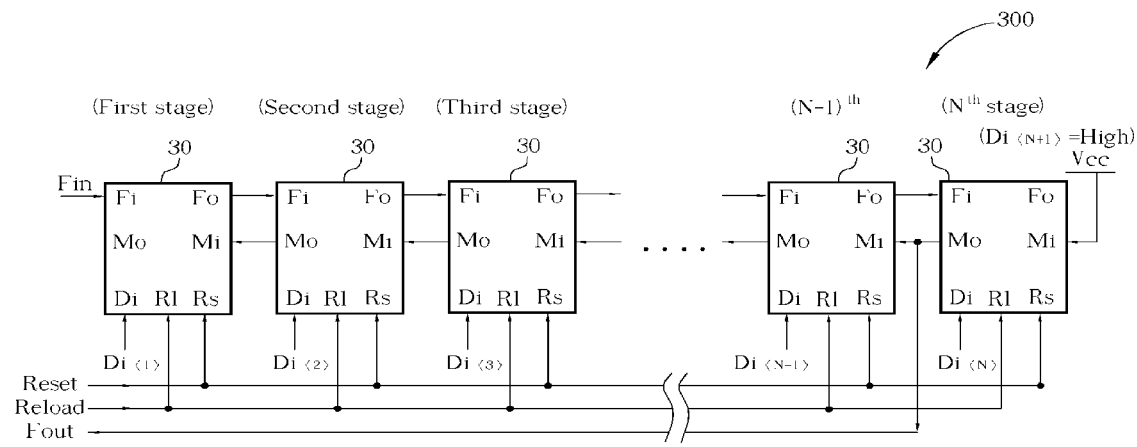
FIG. 7 is a schematic diagram of a programmable frequency divider according to the third embodiment of the present invention.

Please refer to FIG. 7, which depicts a schematic diagram of a programmable frequency divider 300 according to a third embodiment of the present invention. The programmable frequency divider 300 comprises N cascaded dividing cells 30, wherein each cell 30 has a first input node (Fi), a second input node (Mi), a third input node (Di), a fourth input node (Rs), a fifth input node (Rl), a first output node (Fo), and a second output node (Mo). Depending on the cascading sequence, the cells 30 of FIG. 7 are respectively defined from left to right as a first stage cell 30, a second stage cell 30, . . . , and an $N^{th}$ stage cell 30.

As shown in FIG. 7, the cells 30 of the programmable frequency divider 300 are cascaded with each other in a way similar to the above embodiments. The difference is that each $P^{th}$ stage cell 30 not only has the fourth input node (Rs) to receive a reset signal to synchronously reset its dividing operation, but also has the fifth input node (Rl) to receive a reload signal to synchronously reload a corresponding divisor signal $Di_{<P>}$, on the third input node (Di), wherein the reloaded divisor signal $Di_{<P>}$, is used for switching the cell 30 to perform either a divide-by-two or a divide-by-three operation. In practical implementations, a control circuit (not shown) is employed to generate the reset signal and the reload signal. Accordingly, the programmable frequency divider 300 is not only capable of synchronously resetting all cells 30 but also capable of synchronously reloading all cells 30 with a corresponding divisor signal.

In the third embodiment of the present invention, a source signal Fin is input into the first input node (Fi) of the first cell 30 of the programmable frequency divider 300. Each cell 30 then processes the source signal Fin depending upon its dividing mode. Afterward, a result signal Fout at a divided frequency is output from the second output node (Mo) or the first output node (Fo) of the cell 30 in the $N^{th}$ stage (i.e., the last stage). The ratio of the frequency of the result signal Fout to the frequency of the source signal Fin is configured by the set of programmable divisor signals that are synchronously loaded on the third input node (Di) of each cell 30 respectively. When the divisor is changed to a new value, the signal levels of binary divisor signals are updated correspondingly and are received on the third input node (Di) of each cell 30 respectively. At this moment, each cell 30 has not yet loads the updated divisor signal. A reload signal is then loaded on the fourth input node (Rl) of each cell 30 so that each cell 30 synchronously loads the corresponding divisor signal on the third input node (Di). Meanwhile, a reset signal being logic 1 is employed to synchronously reset all cells 30 of the programmable frequency divider 300. When the reset signal changes to logic 0, each cell 30 renews its operation according to the loaded divisor signal.

Figure 8:
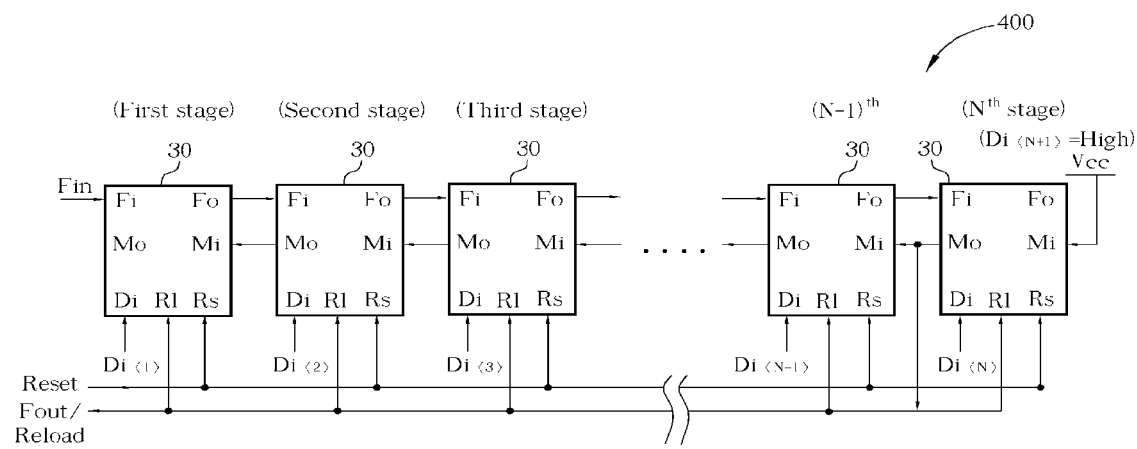
FIG. 8 is a schematic diagram of a programmable frequency divider according to the fourth embodiment of the present invention.

Please refer to FIG. 8 as well as to FIG. 7. FIG. 8 depicts a schematic diagram of a programmable frequency divider 400 according to a fourth embodiment of the present invention. The programmable frequency divider 400 is similar to the third embodiment (the programmable frequency divider 300 of the present invention shown in FIG. 7) but has a simplified circuit design. In the programmable frequency divider 400, the fourth input node (Rl) of each cell 30 is coupled to the result signal Fout output from the second output node (Mo) of the $N^{th}$ stage (i.e. the last stage) cell 30. In other words, the result signal Fout output from the last stage cell 30 of the programmable frequency divider 400 is used as the reload signal. Thus, when the clock edge of the result signal Fout triggers the fourth input node (Rl) of each cell 30, each cell 30 is synchronously reloaded with a corresponding divisor signal no matter whether the divisor signal has changed or not.

Figure 9:
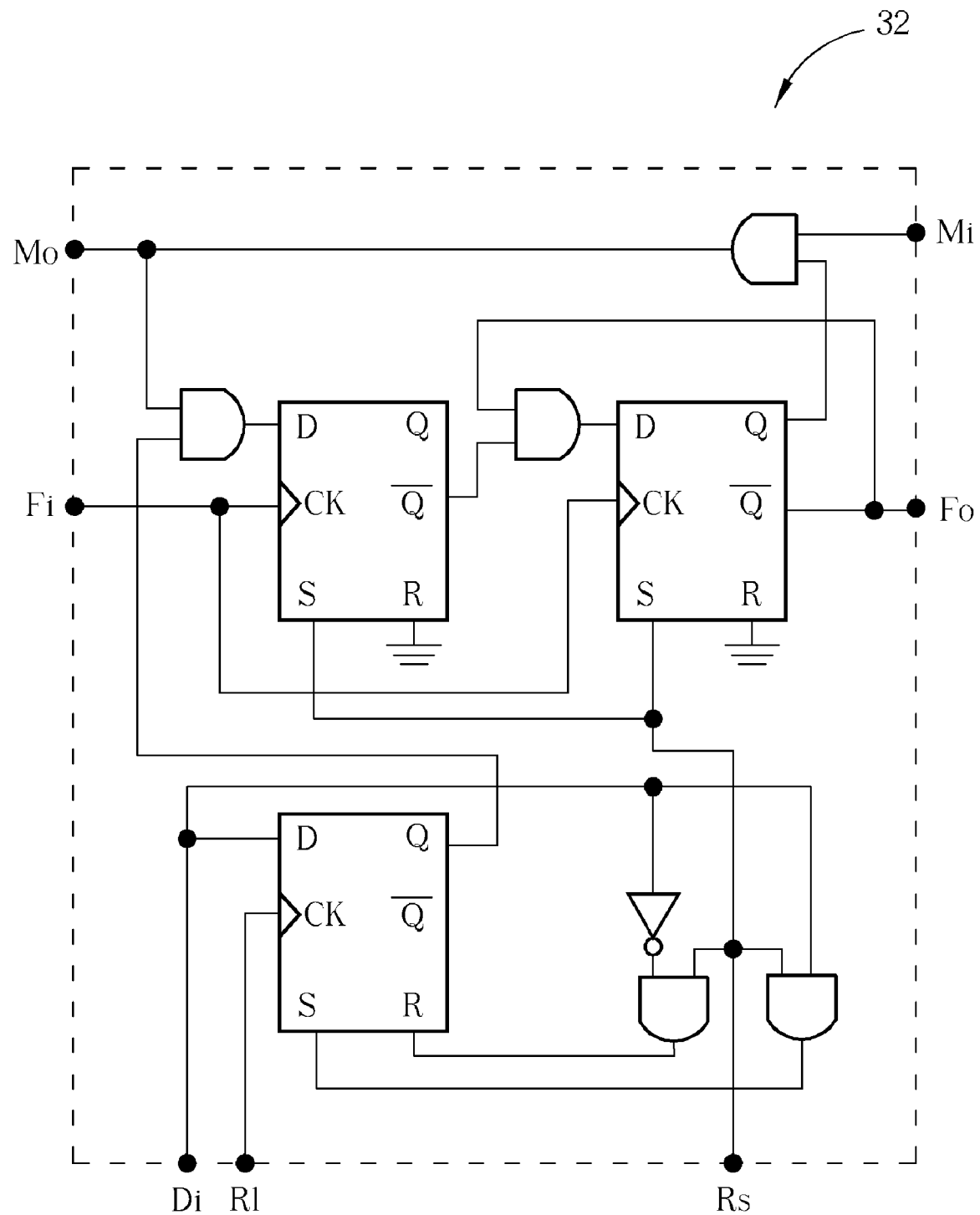
FIG. 9 is a circuit diagram of the cell 30 in FIG. 7 and FIG. 8.

FIG. 9 depicts a circuit diagram 32 according to one embodiment of the cell 30 of FIG. 7 and FIG. 8. According to the circuit diagram 32 shown in FIG. 9, regardless of whether the logic level of the second input node (Mi) is logic 1 or logic 0, if the first output node (Fo) is at logic 0 and the third input node (Di) is at logic 0 when the fifth input node (Rl) is triggered by the reload signal, the cell 30 will perform a divide-by-two operation. In the divide-by-two operation, the positive edge of a clock signal of the first input node (Fi) triggers the first output node (Fo) to output a half frequency signal. On the other hand, if the second input node (Mi) is at logic 1, the first output node (Fo) is at logic 0, and the third input node (Di) is at logic 1 when the fifth input node (Rl) is triggered by the reload signal, the cell 30 will perform a divide-by-three operation. In the divide-by-three operation, the positive edge of the clock signal of the first input node (Fi) triggers the first output node (Fo) to output a one-third-frequency signal.

If the first output node (Fo) is at logic 0, the second output node (Mo) outputs a signal at the same logic level as the second input node (Mi). In addition, regardless of the logic level of the second input node (Mi), if the first output node (Fo) is at logic 1, the second output node (Mo) outputs a logic 0 signal.

Furthermore, if the reset signal received on the fourth input node (Rs) is at an active state (e.g. at logic 1 in this embodiment), the first output node (Fo) outputs a logic 0 signal. Additionally, if the second input node (Mi) is at logic 1 at this moment, the second output node (Mo) outputs a logic 1 signal.

In other words, according to the circuit diagram 32 of FIG. 9, regardless of the logic level of the second output node (Mo), if the third input node (Di) is at logic 0 when the fifth input node (Rl) is triggered by the reload signal, the cell 30 will operate in the divide-by-two mode. The positive edge of a clock signal of the first input node (Fi) triggers the first output node (Fo) to output a half frequency signal. On the other hand, if the second output node (Mo) is at logic 1 and the third input node (Di) is at logic 1 when the fifth input node (Rl) is triggered by the reload signal, the cell 30 will operate in the divide-by-three mode. The positive edge of the clock signal of the first input node (Fi) triggers the first output node (Fo) to output a one-third-frequency signal.

In addition, similar to the above embodiments, in both the programmable frequency divider 300 and 400, the signal received on the first input node (Fi) of each cell 30 is the operating clock of the cell 30. As mentioned above, the operating clock of each cell 30 is sequentially delivered from the first stage to the last stage (the N$^{th}$ stage) so that the programmable frequency divider 300 or 400 completes a whole division cycle. Similarly, the signal received on the second input node (Mi) of each cell 30 acts as an enabling signal that is involved in cell 30's switching its operation mode. The enabling signal propagates from the N$^{th}$ stage cell 30 back to the first stage cell 30. As shown in the foregoing illustration, this design supports the previous stages to operate in high frequency.

Note that in the third and forth embodiments of the present invention, an important technical feature is that each cell 30 of the programmable frequency divider 300 or 400 is synchronously reloaded with a corresponding divisor signal and is synchronously reset. After being synchronously reset, each cell 30 renews its operation according to the newly loaded divisor signal. In this way, the present invention not only guarantees that the frequency of the result signal Fout is the division result of the frequency of the source signal Fin divided by the divisor, but also guarantees that the result signal Fout has continuous pulses.

Figure 10:
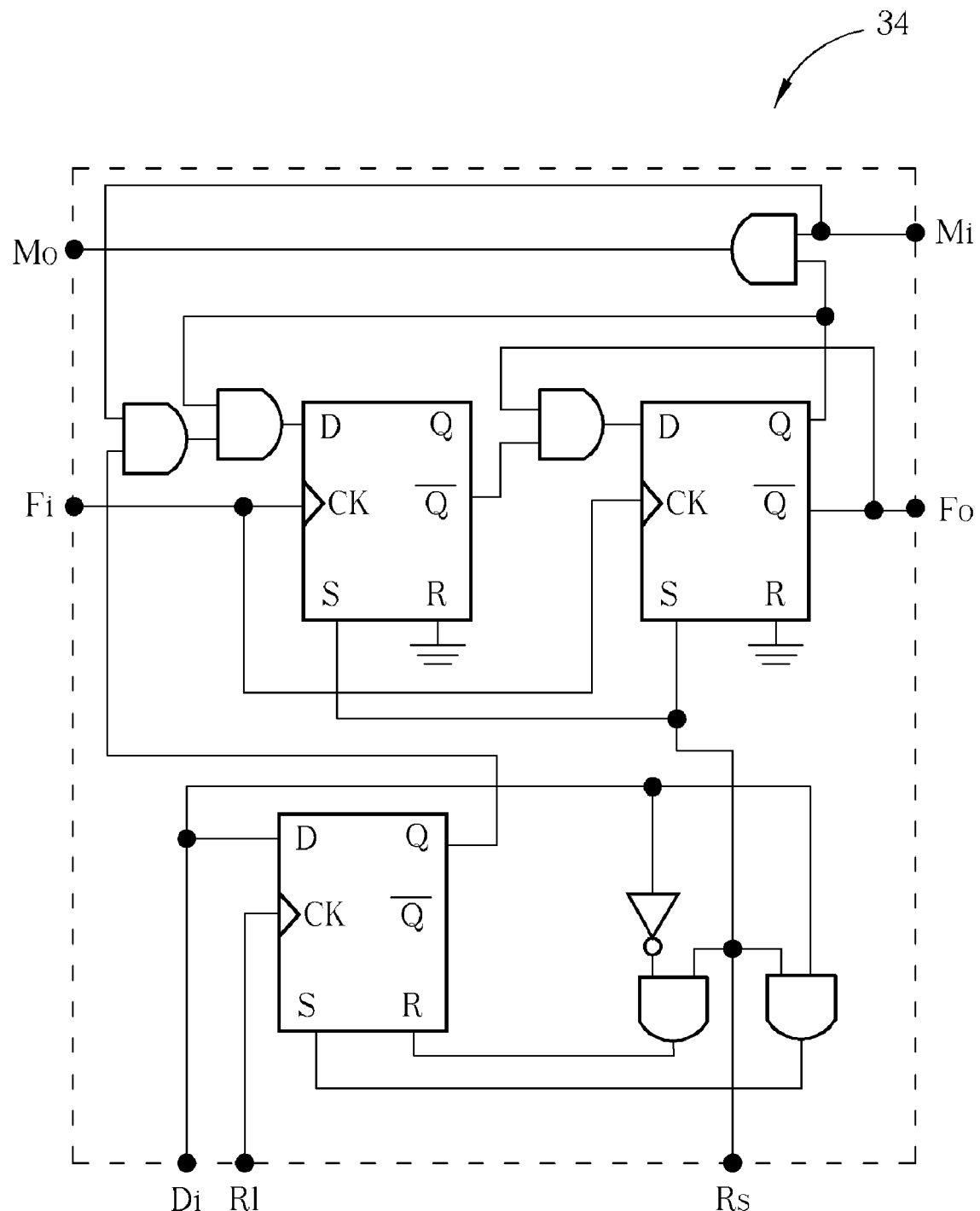
FIG. 10 is another circuit diagram of the cell 30 in FIG. 7 and FIG. 8.

Please refer to FIG. 10 as well as to FIG. 9. The circuit diagram 34 shown in FIG. 10 is another embodiment of the cell 30 shown in FIG. 7 and FIG. 8. As shown in FIG. 10, the circuit diagram 34 utilizes one more AND gate than the circuit diagram 32 of FIG. 9. Similarly, this design improves the output speed of the second output node (Mo) of the circuit diagram 34. The logical operation of the circuit diagram 34 is substantially the same as the circuit diagram 32 and further details are therefore omitted here.

Figure 11:
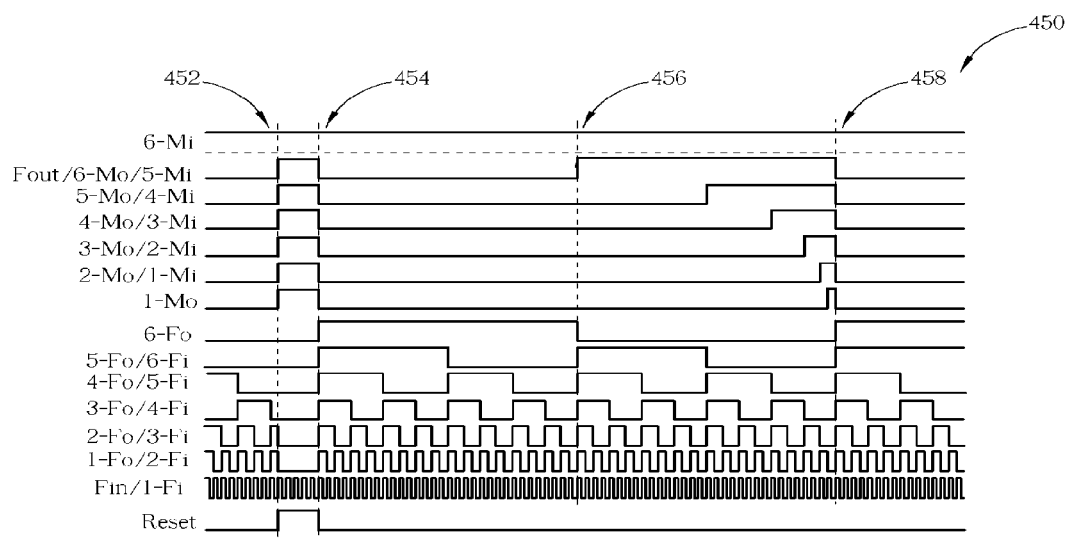
FIG. 11 is a timing diagram of the programmable frequency divider of FIG. 8 according to the present invention.

Please refer to FIG. 11 as well as to FIG. 8. FIG. 11 depicts a timing diagram of the programmable frequency divider 400 of FIG. 8. In FIG. 11, for convenience of description, it assumed that the programmable frequency divider 400 has six stages of cells 30. In this embodiment, since the second input node (Mi) of the last stage (i.e. the sixth stage) cell 30 is coupled to Vcc and is thereby always at logic 1 level, i.e., the last divisor signal Di$_{<7>}$ is a logic 1. Accordingly, the smallest divisor value of the programmable frequency divider 400 is 64 (2$^6$=64) in this embodiment. As shown in the timing diagram 450, regardless of the original operation mode of each cell 30, all cells 30 are synchronously reset and stop dividing operations while the reset signal is enabled during time 452 through time 454. During this period, the signal output from the first output node (Fo) of each cell 30, respectively denoted by 1-Fo, 2-Fo, 3-Fo, 4-Fo, 5-Fo, and 6-Fo, becomes logic 0.

As mentioned above, during the period from time 452 through time 454, because of the second input node (Mi) of the last stage cell 30 is at logic 1, its second output node (Mo) outputs logic 1 signal during the period accordingly. In addition, since the second output node (Mo) of each stage is connected to the second input node (Mi) of its previous stage, the signal output from the second output node (Mo) of each stage, respectively denoted by 1-Mo, 2-Mo, 3-Mo, 4-Mo, 5-Mo, and 6-Mo, becomes logic 1.

At time 454, the reset signal becomes disabled (i.e., falls to logic 0), which means all cells 30 have been synchronously reset, so each cell 30 renews its operation according to the divisor signal loaded when reset. In FIG. 11, all divisor signals loaded to all cells 30 are assumed logic 0 and all cells thereby will perform the divide-by-two operation. Accordingly, the divisor of the programmable frequency divider 400 is 64. At time 454, since a rising edge of the source signal Fin (i.e., the signal 1-Fi input into the first input node (Fi) of the first stage cell 30) occurs, the first stage cell 30 operates in the divide-by-two mode and outputs a frequency-divided signal 1-Fo from its first output node (Fo). The signal 1-Fo is also the operating clock of the second stage cell 30, 2-Fi. A rising edge of the operating clock 2-Fi triggers the second stage cell 30 to perform dividing operation. The second stage cell 30 then outputs a frequency-divided signal 2-Fo from its first output node (Fo) to be the operating clock of the third stage cell 30, 3-Fi. By this way, the P$^{th}$ stage cell 30 outputs a frequency-divided signal P-Fo from its first output node (Fo) to be the operating clock of the (P+1)$^{th}$ stage cell 30, (P+1)-Fi. Finally, at time 458, the programmable frequency divider 400 completes the first division cycle after reset. The signal output from the second output node (Mo) of the final stage, 6-Mo, is employed to be the result signal Fout. The frequency of the result signal Fout is 1/64 of the frequency of the source signal Fin. If using the signal output from the first output node (Fo) of the last stage cell to be the result signal Fout, the frequency of the result signal Fout is also 1/64 of the frequency of the source signal Fin.

As mentioned above, the signal output from the second output node (Mo) of the last stage cell 30, 6-Mo, is also employed to be the reload signal of the programmable frequency divider 400. In the timing diagram 450, the divisor signals received on the third input node (Di) of each cell 30 are logic 0 at time 456. After a rising edge of the signal 6-Mo triggers each cell 30 to reload a corresponding divisor signal, the divisor of the programmable frequency divider 400 remains at 64. Accordingly, each cell 30 repeats the divide-by-two operation in a next division cycle. Therefore, the frequency of the result signal Fout (6-Mo) is still 1/64 of the frequency of the source signal Fin.

As shown in FIG. 11, the signals output from the second output node (Mo) of each stage, 1-Mo, 2-Mo, 3-Mo, 4-Mo, 5-Mo, and 6-Mo, are periodic signals with identical period and only differ in pulse width. So it is also feasible to use any of these signals as the result signal Fout of the programmable frequency divider 400. In practical implementations, an advantage of using the signal 6-Mo output from the last stage cell 30 as the reload signal is that the signal 6-Mo has a wider pulse width than the others (i.e., 1-Mo, 2-Mo, 3-Mo, 4-Mo, and 5-Mo). This feature is helpful to reduce the requirement of detecting high frequency signal for the cell 30 and the cost of the programmable frequency divider is thereby reduced.

According to above illustration of the timing diagram 450 of the programmable frequency divider 400, it is known that the fourth embodiment of the present invention has at least two features:

(a) All cells 30 are synchronously reset. After being reset, each cell 30 renews its dividing operation according to the current divisor signal. In other words, the programmable frequency divider 400 renews its operation according to the current divisor.

(b) The result signal Fout is used as the reload signal to trigger each cell 30 to synchronously reload a corresponding divisor signal.

In the above embodiments, the manner used in the programmable frequency divider of the present invention to solve the problem concerning incorrect output frequency while changing the divisor has been disclosed. In order to further solve the problem of the division range limited by the number of employed dividing cells, the present invention combines the original cell with simple logic gates to add a bypass mode to the cell. The architecture of the programmable frequency divider with wider division range of the present invention is illustrated in the following.

Figure 12:
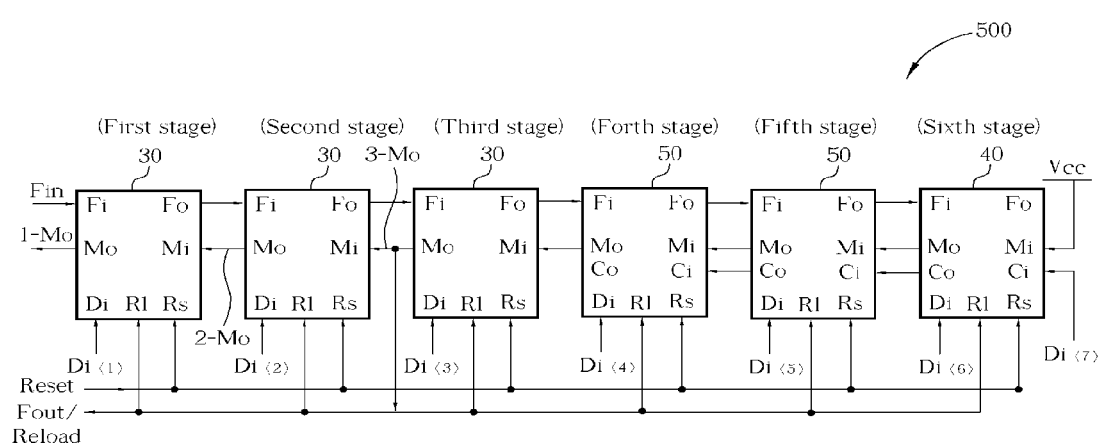
FIG. 12 is a schematic diagram of a programmable frequency divider according to the fifth embodiment of the present invention.

FIG. 12 depicts a schematic diagram of a programmable frequency divider according to a fifth embodiment of the present invention. A programmable frequency divider 500 comprises three cells 30, a cell 40, and two cells 50. Each cell 30 has a first input node (Fi), a second input node (Mi), a third input node (Di), a fourth input node (Rs), a fifth input node (Rl), a first output node (Fo), and a second output node (Mo). The three cells 30 are respectively defined from left to right as a first stage cell 30, a second stage cell 30, and a third stage cell 30. Each cell 50 has a first input node (Fi), a second input node (Mi), a third input node (Di), a fourth input node (Rs), a fifth input node (Rl), a sixth input node (Ci), a first output node (Fo), a second output node (Mo), and a third output node (Co). Similarly, the two cells 50 are respectively defined from left to right as a fourth stage cell 50 and a fifth stage cell 50. The cell 40 has a first input node (Fi), a second input node (Mi), a third input node (Di), a fourth input node (Rs), a fifth input node (Rl), a sixth input node (Ci), a first output node (Fo), a second output node (Mo), and a third output node (Co), and is defined as a sixth stage cell 40.

As shown, the cascading manner of the three cells 30 is substantially the same as the above embodiments and further details are therefore omitted here. Regarding the fourth stage cell 50, its first input node (Fi) is coupled to the first output node (Fo) of the third stage cell 30; its second output node (Mo) is coupled to the second input node (Mi) of the third stage cell 30; its first output node (Fo) is coupled to the first input node (Fi) of the fifth stage cell 50; its second input node (Mi) is coupled to the second output node (Mo) of the fifth stage cell 50; and its sixth input node (Ci) is coupled to the third output node (Co) of the fifth stage cell 50.

Regarding the fifth stage cell 50, its first output node (Fo) is coupled to the first input node (Fi) of the cell 40; its second input node (Mi) is coupled to the second output node (Mo) of the cell 40; and its sixth input node (Ci) is coupled to the third output node (Co) of the cell 40.

Regarding the cell 40, its second input node (Mi) is coupled to logic 1, (e.g. coupled to Vcc) and its sixth input node (Ci) is coupled to the last divisor signal $Di_{<7>}$. In addition, each cell of the programmable frequency divider 500 receives a corresponding divisor signal $Di_{<P>}$ ($1 \leq P \leq 6$) from the third input node (Di) and receives a reset signal from the fourth input node (Rs). Wherein the reset signal is employed to synchronously reset each cell and is generated by a control circuit (not shown). Additionally, the fifth input node (Rl) of each cell is coupled to the second output node (Mo) of the third stage cell 30. The signal output from the second output node (Mo) of the third stage cell 30, 3-Mo, is employed as a reload signal. In this embodiment, the signal, 3-Mo, is also employed as a result signal Fout.

The operation of the programmable frequency divider 500 is similar with above embodiments. The programmable divisor value is also presented as a set of binary divisor signals $Di_{<1>}$, $Di_{<2>}$, $Di_{<3>}$, . . . , and $Di_{<7>}$. The programmable frequency divider 500 divides the frequency of a source signal Fin received on the first input node (Fi) of the first stage cell 30 according to the divisor value. In the previous embodiments, if N cells are employed, since the last divisor signal ($D_{<N+1>}$) is at logic 1 level, the allowable divisors are integers from $2^N$ to $2^{N+1}-1$. In the fifth embodiment, however, each of the last three stages (i.e., the fourth stage cell 50, the fifth stage cell 50, and the sixth stage cell 40) has a bypass mode.

The signal received on the sixth input node (Ci) of the cell 40 or 50 is a bypass-mode enabling signal. When the bypass-mode enabling signal is active, for example at logic 0 level, the cell is at a bypass state and does not perform any dividing operation. Accordingly, the division range of the programmable frequency divider 500 is no longer the integers from $2^6$ to $2^7-1$ and is extended to the integers from $2^3$ to $2^7-1$ (i.e., from 8 to 127). In addition, only simple flip-flops and logic combinations are required for the programmable frequency divider of the present invention to extend the division range, the complexity and cost of implementation is thereby decreased.

Note that, D flip-flops are preferably employed in the programmable frequency divider as an example. In practical implementation, any type of flip-flops should also be included in the embodiment.

Figure 13:
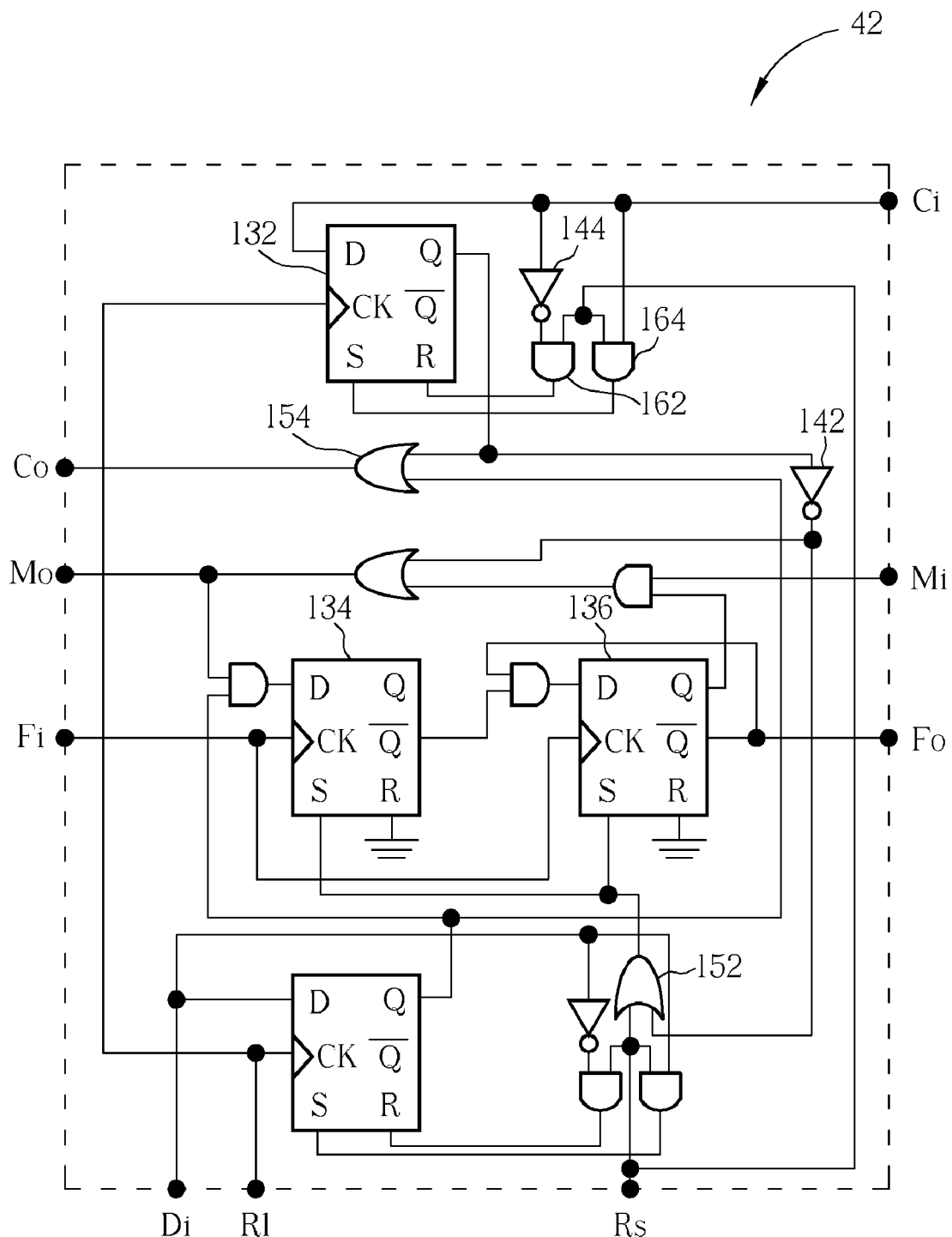
FIG. 13 is a circuit diagram of the cell 40 of FIG. 12.

Please refer to FIG. 13 as well as to FIG. 12. FIG. 13 depicts a circuit diagram 42 according to one embodiment of the cell 40 of FIG. 12. As shown in FIG. 12, the cell 40 is configured in the last stage. The second input node (Mi) is coupled to Vcc (i.e., logic 1 level); the third input node (Di) and the sixth input node (Ci) is coupled to the last two divisor signals $Di_{<6>}$ and $Di_{<7>}$, respectively. In the circuit diagram 42, when the reload signal on the fifth input node (Rl) triggers the cell 40, the divisor signals $Di_{<6>}$ on the third input node (Di) and the $Di_{<7>}$ on the sixth input node (Ci) are synchronously loaded into the cell 40. At that moment, if the last divisor $Di_{<7>}$ is at logic 0, a flip-flop 132 outputs a logic 0 signal. A NOT gate 142 then converts the logic 0 signal into a logic 1 signal. Next, the logic 1 signal is transmitted into an OR gate 152, so that the output of the OR gate 152 is thereby maintained in logic 1 level to reset flip-flops 134 and 136. Obviously, regardless of the value of the divisor signal $Di_{<6>}$ on the third input node (Di) of the cell 40, the cell 40 does not perform any dividing operation, i.e., it is at the so-called bypass state. Thus, when the last divisor signal $Di_{<7>}$ is at logic 0, the cell 40 is bypassed.

Please refer back to FIG. 2. In the circuit diagram 12, as mentioned above, when the reset signal received on the fourth input node (Rs) is at logic 1, the cell 10 does not perform any dividing operation. The cell then renews its operation when the reset action is completed. Similarly, in FIG. 13, when the sixth input node (Ci) of the circuit diagram 42 receives a logic 0 signal, i.e., the bypass-mode enabling signal is at an active state, the flip-flops 134 and 136 are both at the reset state so that the cell 40 does not perform any dividing operation. Thus, when the sixth input node (Ci) of the cell 40 loaded with a logic 0 signal, the cell 40 is bypassed and can be regarded as in the reset state.

In addition, when the reload signal on the fifth input node (Rl) triggers the cell 40, if the divisor signals $Di_{<6>}$ and $Di_{<7>}$ loaded into the cell 40 are both at logic 0, an OR gate 154 outputs a logic 0 signal. The logic 0 signal is then output from the third output node (Co) of the cell 40 to the sixth input node (Ci) of the previous stage (the fifth stage) to bypass the previous stage.

Figure 15:
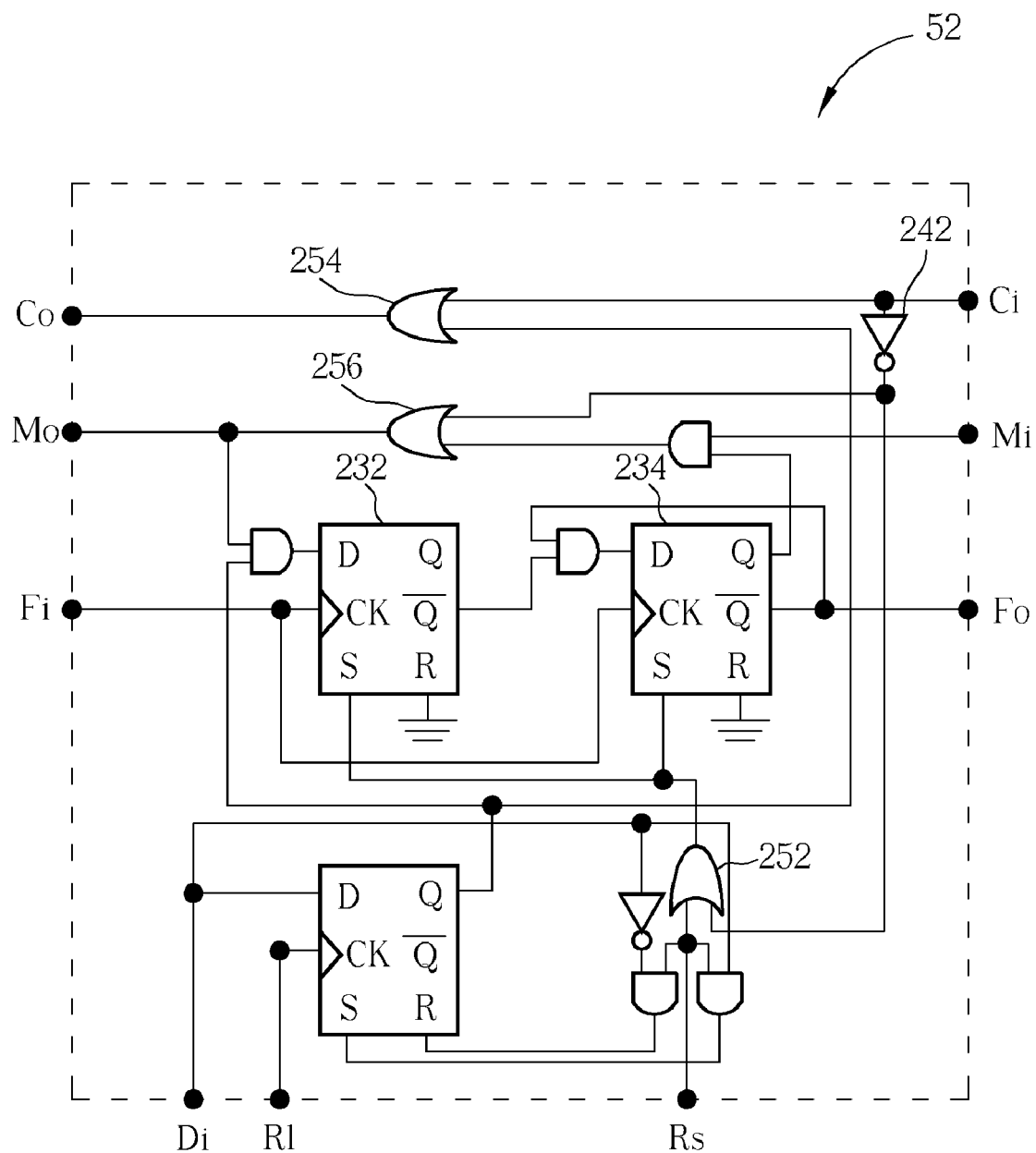
FIG. 15 is a circuit diagram of the cell 50 of FIG. 12.

Please refer to FIG. 15, which depicts a circuit diagram 52 according to one embodiment of the cell 50 of FIG. 12. In the circuit diagram 52, when the signal received on the sixth input node (Ci) is at logic 0, similar with the circuit diagram 42 of FIG. 13, a NOT gate 242 converts the logic 0 signal into a logic 1 signal. The logic 1 signal is then transmitted to an OR gate 252. Next, the OR gate 252 outputs a logic 1 signal to reset flip-flops 232 and 234. At that moment, the cell 50 is bypassed and does not perform any dividing operation. Similarly, in the circuit diagram 52, if the signals on the sixth input node (Ci) and the loaded signal from the third input node (Di) are both at logic 0, an OR gate 254 outputs a logic 0 signal. The logic 0 signal is then transmitted from the third output node (Co) of the cell 50 to the sixth input node (Ci) of a previous stage to bypass the previous stage.

Regarding the above illustration of the circuit diagrams 42 and 52, a conclusion is obtained as follows: in the fifth embodiment of the present invention, when the loaded signals respectively from the last two divisor signals $Di_{<6>}$, and $Di_{<7>}$, are both at logic 0, the cell 40 and the fifth stage cell 50 of the programmable frequency divider 500 are both bypassed. Furthermore, when the divisor signals $Di_{<5>}$, $Di_{<6>}$, and $Di_{<7>}$ that have been loaded are all at logic 0, the cell 40, the fourth stage cell 50 and the fifth stage cell 50 are all bypassed. Thus, the division range of the programmable frequency divider 500 can be extended by properly setting the divisor signals $Di_{<1>}$, $Di_{<2>}$, $Di_{<3>}$, ..., and $Di_{<7>}$.

For example, if the sequence of values of the divisor signals $Di_{<7>}$, $Di_{<6>}$, $Di_{<5>}$, ..., and $Di_{<1>}$ is 0001000, which is the binary value of 8, this means the divisor value is 8. If the sequence of values of the divisor signals $Di_{<7>}$, $Di_{<6>}$, $Di_{<5>}$, ..., and $Di_{<1>}$ is 0001001, which is the binary value of 9, this means the divisor value is 9. If the sequence of values of the divisor signals $Di_{<7>}$, $Di_{<6>}$, $Di_{<5>}$, ..., and $Di_{<1>}$ is 0111111, this means the divisor value is 63. If the sequence of values of the divisor signals $Di_{<7>}$, $Di_{<6>}$, $Di_{<5>}$, ..., and $Di_{<1>}$ is 1000000, this means the divisor value is 64. If the sequence of values of the divisor signals $Di_{<7>}$, $Di_{<6>}$, $Di_{<5>}$, ..., and $Di_{<1>}$ is 1111111, this means the divisor value is 127.

In the fifth embodiment shown in FIG. 12, since the last three stages of the programmable frequency divider 500 is possibly bypassed, the signal, 3-Mo, output from the second output node (Mo) of the third stage cell 30 is employed as the result signal Fout.

In contrast to the programmable frequency divider 400 of FIG. 8, the programmable frequency divider 500 is also capable of synchronously resetting all cells, so that each cell renews its operation after reset. The programmable frequency divider 500 also utilizes the result signal Fout as the reload signal to trigger each cell to synchronously reload a corresponding divisor signal. The difference between the programmable frequency divider 500 and the programmable frequency divider 400 is that the cell 40 and cell 50, which have a bypass mode, are employed in the programmable frequency divider 500, so that the programmable frequency divider 500 is capable of extending the division range by programming the divisor signals.

Please refer back to FIG. 13, as well as to FIG. 9 and FIG. 15. The circuit diagram 42 shown in FIG. 13 is similar with both the circuit diagram 52 of FIG. 15 and the circuit diagram 32 of FIG. 9. The difference is that the circuit diagram 52 utilizes four more logic gates (three OR gates 252, 254, 256, and one NOT gate 242) than the circuit diagram 32, and the circuit diagram 42 further utilizes four more elements (one flip-flop 132, one NOT gate 144, and two AND gates 162 and 164) than the circuit diagram 52. Accordingly, one advantage of the fifth embodiment of the present invention is that only some flip-flops and simple logic gates are required for adding a bypass mode to the original cell in order to extend the division range of the programmable frequency divider.

Note that, six cells employed in the programmable frequency divider 500 is just an example for convenience of illustration. In practical implementations, the number of cells employed in the programmable frequency divider is not necessarily limited to six, and any number of employed cells should also be included in the embodiment.

Figure 14:
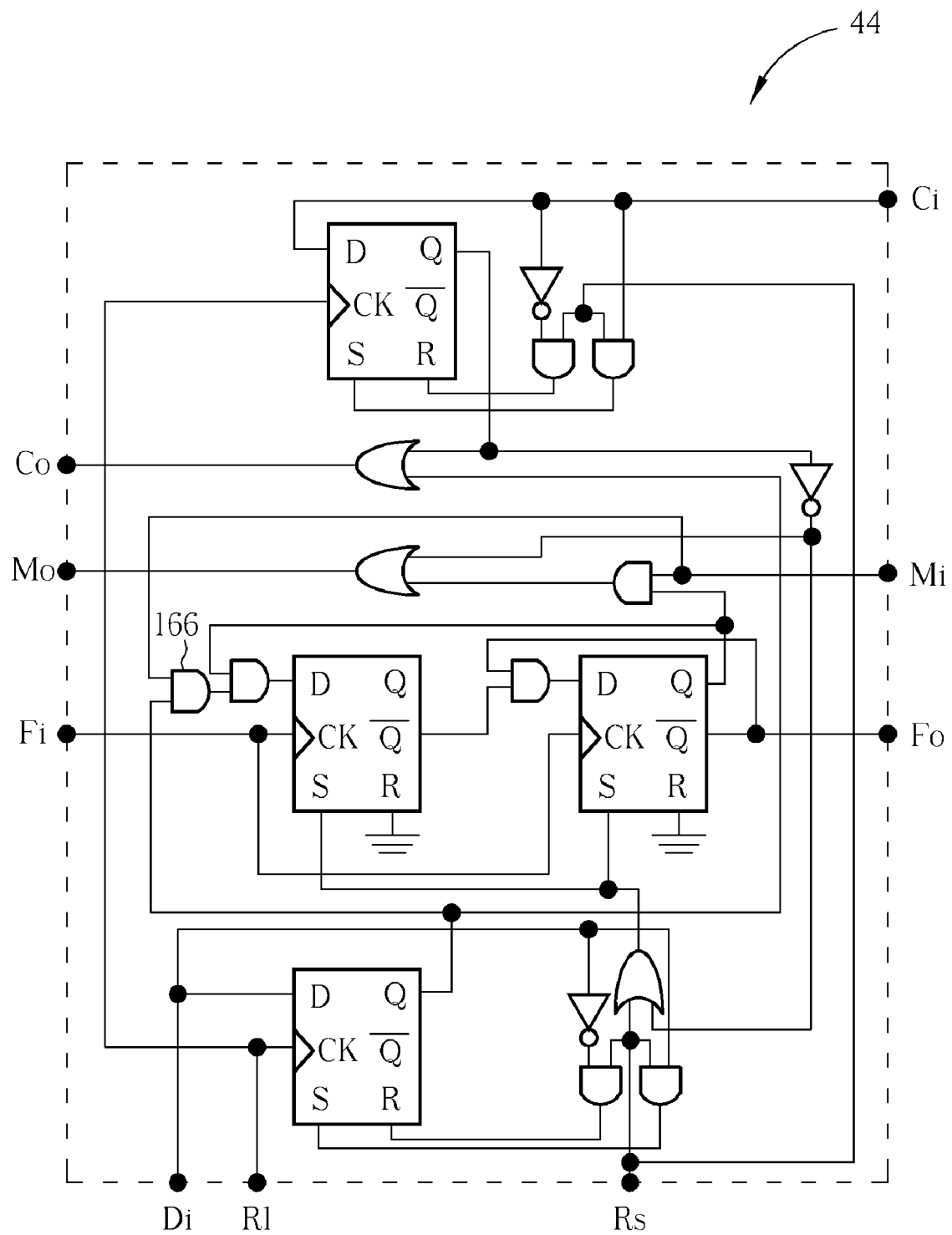
FIG. 14 is another circuit diagram of the cell 40 of FIG. 12.

Please refer to FIG. 14 as well as to FIG. 12 and FIG. 13. FIG. 14 shows a circuit diagram 44 according to another embodiment of the cell 40 of FIG. 12. In contrast to the circuit diagram 42 shown in FIG. 13, obviously, one more AND gate 166 is employed in the circuit diagram 44 to improve output speed of the second output node (Mo). The logical operation of the circuit diagram 44 is substantially the same as the circuit diagram 42 and further details are therefore omitted here.

Figure 16:
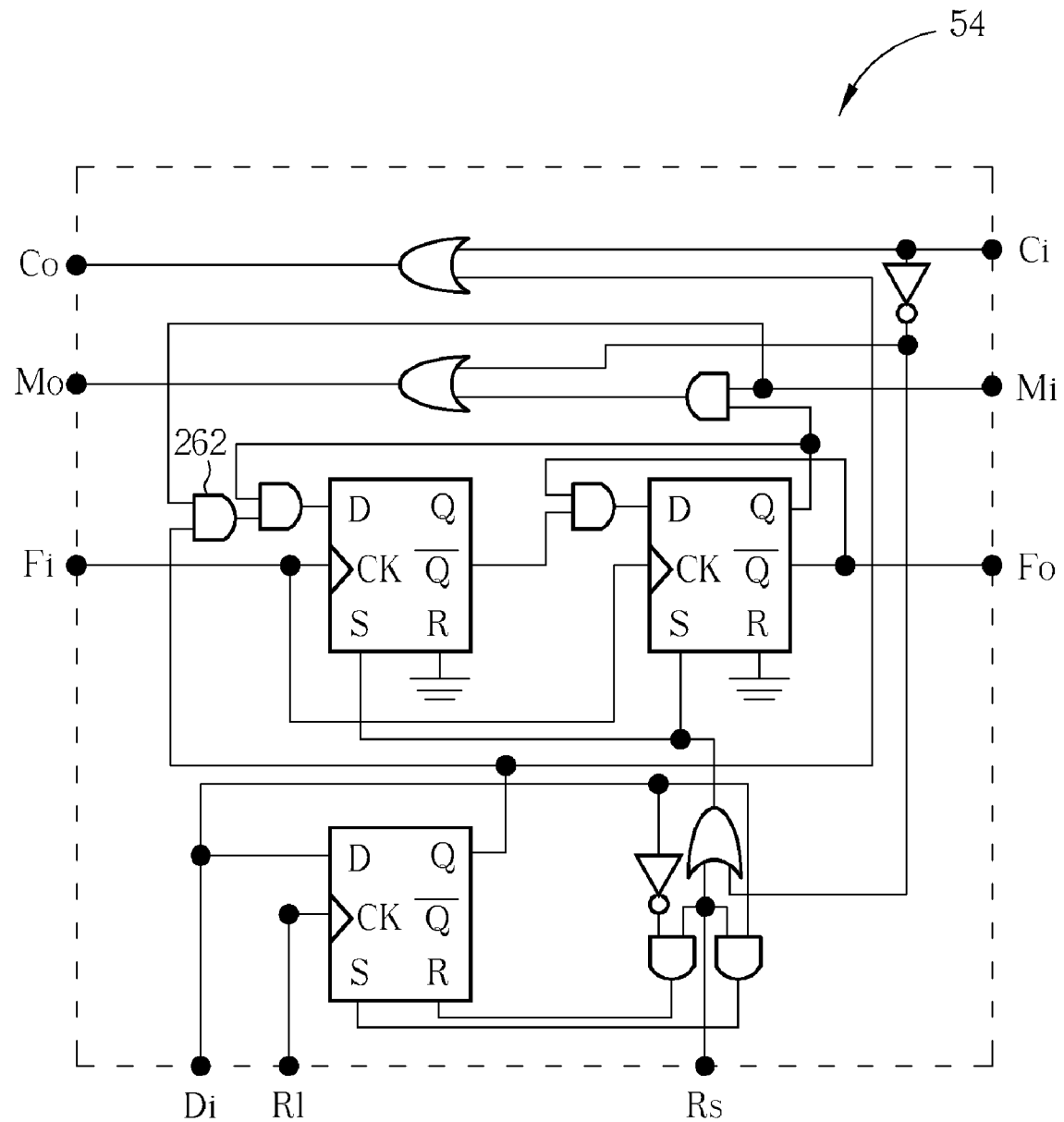
FIG. 16 is another circuit diagram of the cell 50 of FIG. 12.

Please refer to FIG. 16 as well as to FIG. 12 and FIG. 15. The circuit diagram 54 shown in FIG. 16 is another embodiment of the cell 50 of FIG. 12. In contrast to the circuit diagram 52 of FIG. 15, one more AND gate 262 is employed in the circuit diagram 54. Similarly, it improves output speed of the second output node (Mo) of the circuit diagram 54. The logical operation of the circuit diagram 54 is substantially the same as the circuit diagram 52 and further details are therefore omitted here.

Figure 17:
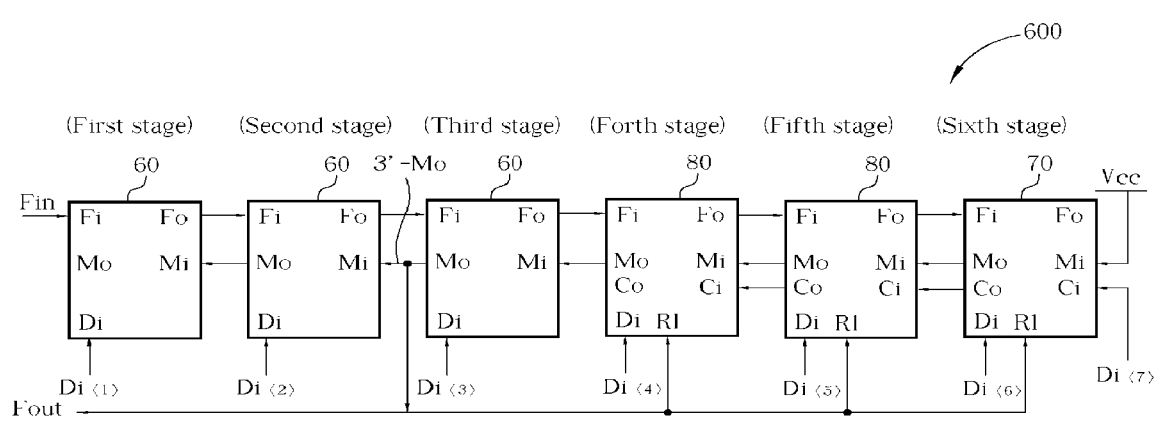
FIG. 17 is a schematic diagram of a programmable frequency divider according to the sixth embodiment of the present invention.

Please refer to FIG. 17, which depicts a schematic diagram of a programmable frequency divider 600 according to the sixth embodiment of the present invention. As an example, the programmable frequency divider 600 comprises three cells 60, one cell 70, and two cells 80. Each of the three cells 60 are cascaded with each other and are respectively defined from left to right as a first stage cell 60, a second stage cell 60, and a third stage cell 60. The two cells 80 are respectively defined from left to right as a fourth stage cell 80 and a fifth stage cell 80, wherein the fourth stage cell 80 is cascaded with the third stage cell 60 and the fifth stage cell 80 is cascaded with the fourth stage cell 80. In addition, the cell 70 is cascaded with the fifth stage cell 80.

As shown in FIG. 17, each cell 60 has a first input node (Fi), a second input node (Mi), a third input node (Di), a first output node (Fo), and a second output node (Mo). Each of the cells 80 and 70 has a first input node (Fi), a second input node (Mi), a third input node (Di), a fourth input node (Rl), a fifth input node (Ci), a first output node (Fo), a second output node (Mo), and a third output node (Co). For each of the first five stages, the first output node (Fo) is coupled to the first input node (Fi) of the next stage, and the second input node (Mi) is coupled to the second output node (Mo) of the next stage. For each cell 80, the fifth input node (Ci) is coupled to the third output node (Co) of the next stage. The first input node (Fi) of the first stage cell 60 is coupled to the source signal Fin. The second input node (Mi) of the cell 70 is coupled to logic 1, e.g. Vcc. The third input node (Di) of each cell is coupled to a corresponding divisor signal $Di_{<N>}$ ($1 \leq N \leq 6$). The fifth input node (Ci) of the cell 70 is coupled to the last divisor signal $Di_{<7>}$. In addition, for each cell from the fourth stage to the sixth stage, the fourth input node (Rl) is coupled to the second output node (Mo) of the third stage cell 60. The signal, denoted by 3'-Mo, output from the third stage cell 60 is employed as a reload signal.

In this embodiment, a source signal Fin is input into the first input node (Fi) of the first stage cell 60 of the programmable frequency divider 600. Each stage processes the source signal Fin, a result signal Fout at a divided frequency is then output from the second output node (Mo) of the third stage cell 60, i.e., the signal 3'-Mo is employed as the result signal Fout. Each stage performs a divide-by-two or a divide-by-three operation depending upon the corresponding loaded divisor signal from the third input node (Di). For each of the fourth through the sixth stages, the signal received on the fifth input node (Ci), i.e., the bypass-mode enabling signal, determines whether the cell should be bypassed or not.

Therefore, the division range of the programmable frequency divider 600 is also the integers from 8 to 127 similar to the fifth embodiment of the present invention. However, the difference is that the sixth embodiment of the present invention only needs to trigger the cells having the bypass mode (such as cells 70 and 80) to synchronously reload the corresponding divisor signal instead of to trigger all cells. Additionally, in the sixth embodiment, when the cell having the bypass mode is bypassed (i.e., when the signal received on its fifth input node (Ci) is at logic 0 state), the cell is simultaneously reset. Thus, the sixth embodiment does not require utilizing an additional reset signal to synchronously reset the cells and the complexity and cost is thereby reduced. The architecture of each cell of the sixth embodiment is discussed as follows.

Figure 18:
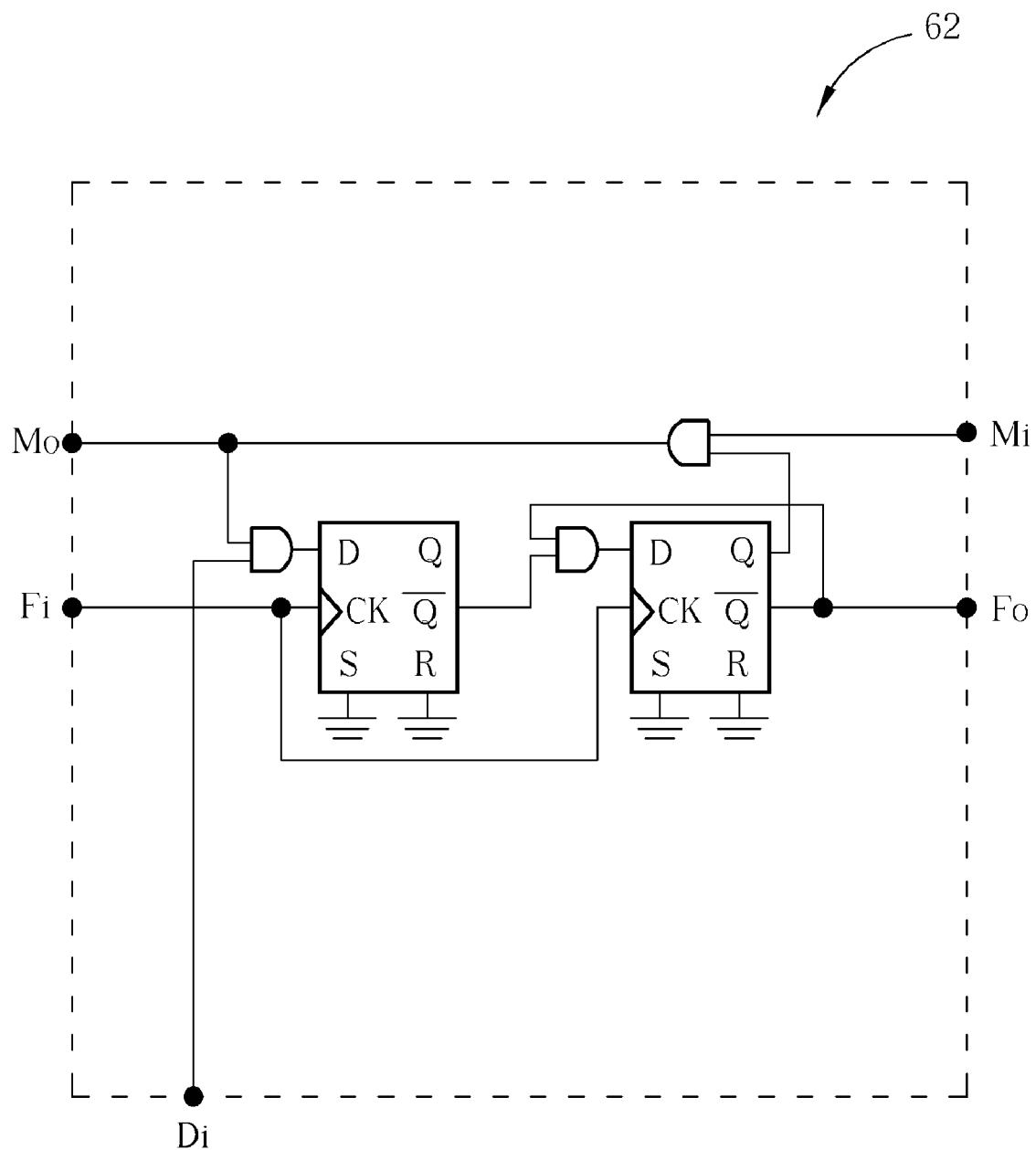
FIG. 18 is a circuit diagram of the cell 60 of FIG. 17.
Figure 19:
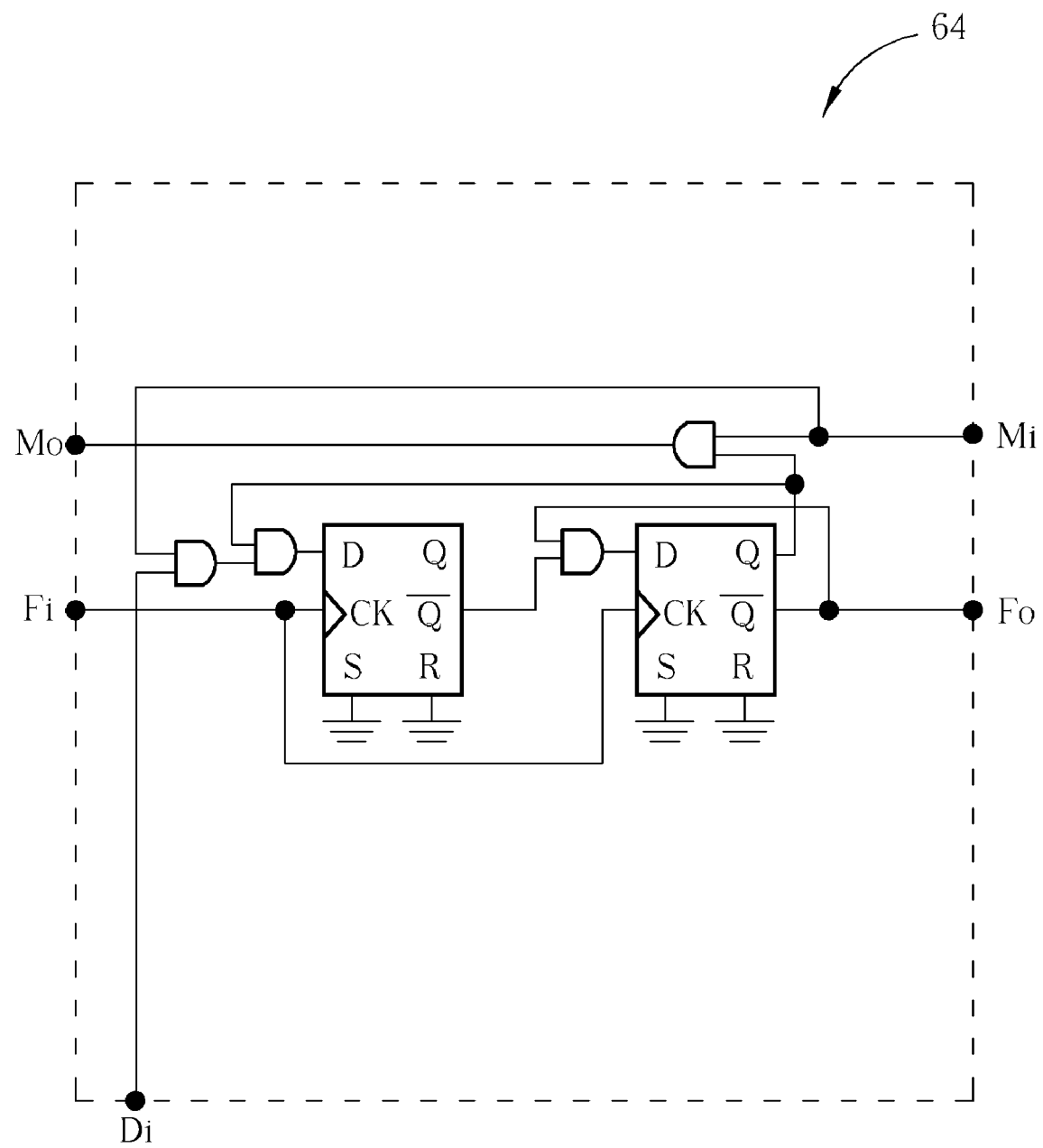
FIG. 19 is another circuit diagram of the cell 60 of FIG. 17.

Please refer to FIG. 18 and FIG. 19 depicting two embodiments of the cell 60 of FIG. 17, which are shown as circuit diagram 62 and circuit diagram 64. The logical operation of the two circuit diagrams 62 and 64 is discussed as follows. In the circuit diagram 62, for example, regardless of the logic level of the second input node (Mi), if the first output node (Fo) is at logic 0 level and the third input node (Di) is at logic 0 level, this means the cell 60 will operate in a divide-by-two mode. Accordingly, the positive edge of a clock signal of the first input node (Fi) triggers the first output node (Fo) to output a half frequency signal. If the second input node (Mi) is at logic 1, the first output node (Fo) is at logic 0, and the third input node (Di) is at logic 1, this means the cell 60 will perform a divide-by-three operation. Thus, the positive edge of a clock signal of the first input node (Fi) triggers the first output node (Fo) to output a one-third-frequency signal. In other words, regardless of the logic level of the second output node (Mo), if the third input node (Di) is at logic 0, this means the cell 60 will perform a divide-by-two operation. Similarly, the positive edge of a clock signal of the first input node (Fi) triggers the first output node (Fo) to output a half frequency signal. If the second output node (Mo) and the third input node (Di) are both at logic 1, this means the cell 60 will operate in a divide-by-three mode. Therefore, the positive edge of the clock signal of the first input node (Fi) triggers the first output node (Fo) to output a one-third-frequency signal.

If the first output node (Fo) is at logic 0, the second output node (Mo) outputs a signal at the same logic level as the second input node (Mi). In addition, regardless of the logic level of the second input node (Mi), if the first output node (Fo) is at logic 1, the second output node (Mo) outputs a logic 0 signal.

The difference between the circuit diagram 64 shown in FIG. 19 and the circuit diagram 62 shown in FIG. 18 is that one more OR gate is employed in the circuit diagram 64 in order to improve the output speed of the second output node (Mo) thereof. The logical operation of the circuit diagram 64 is substantially the same as the circuit diagram 62 and therefore further details are omitted here.

Figure 20:
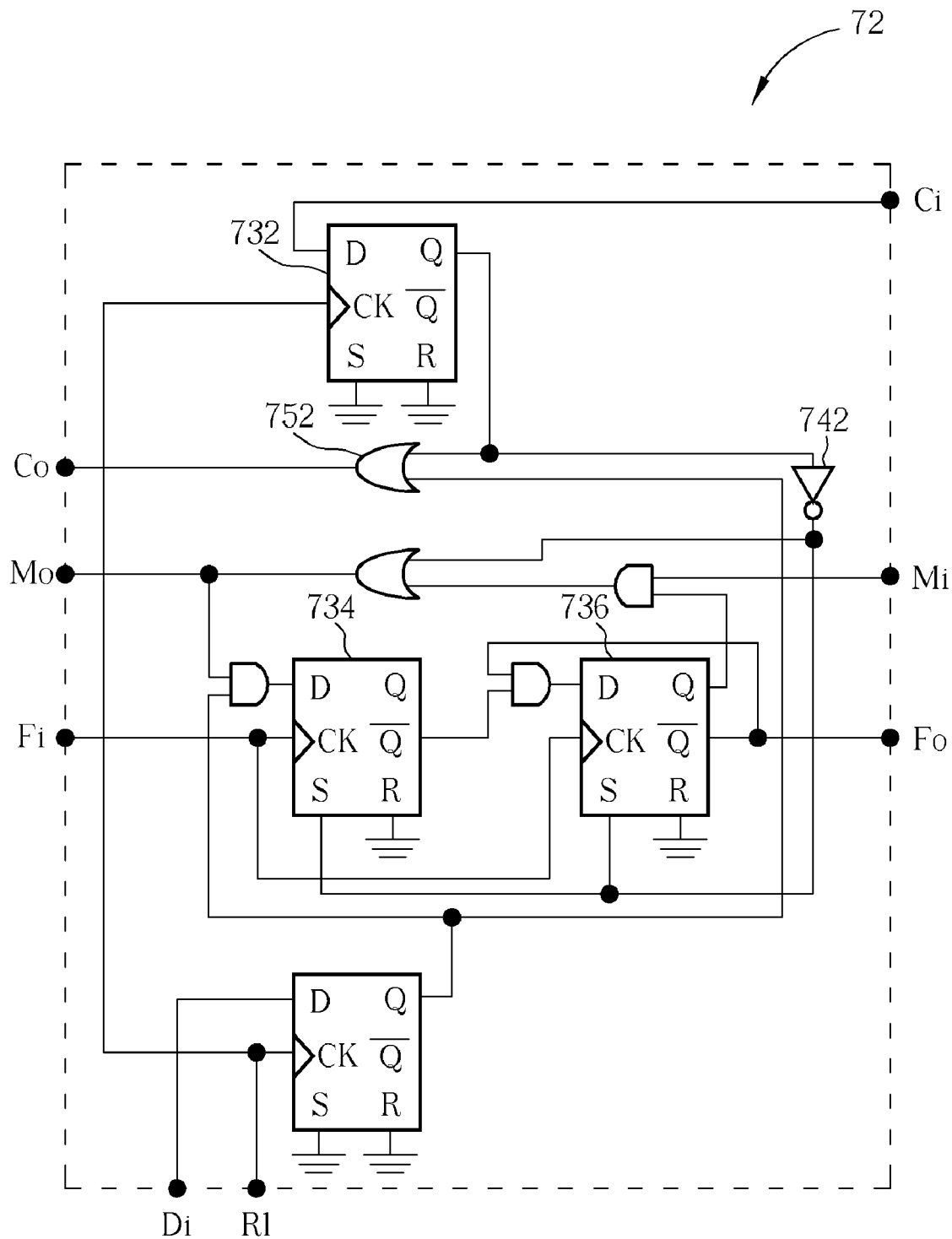
FIG. 20 is a circuit diagram of the cell 70 of FIG. 17.
Figure 21:
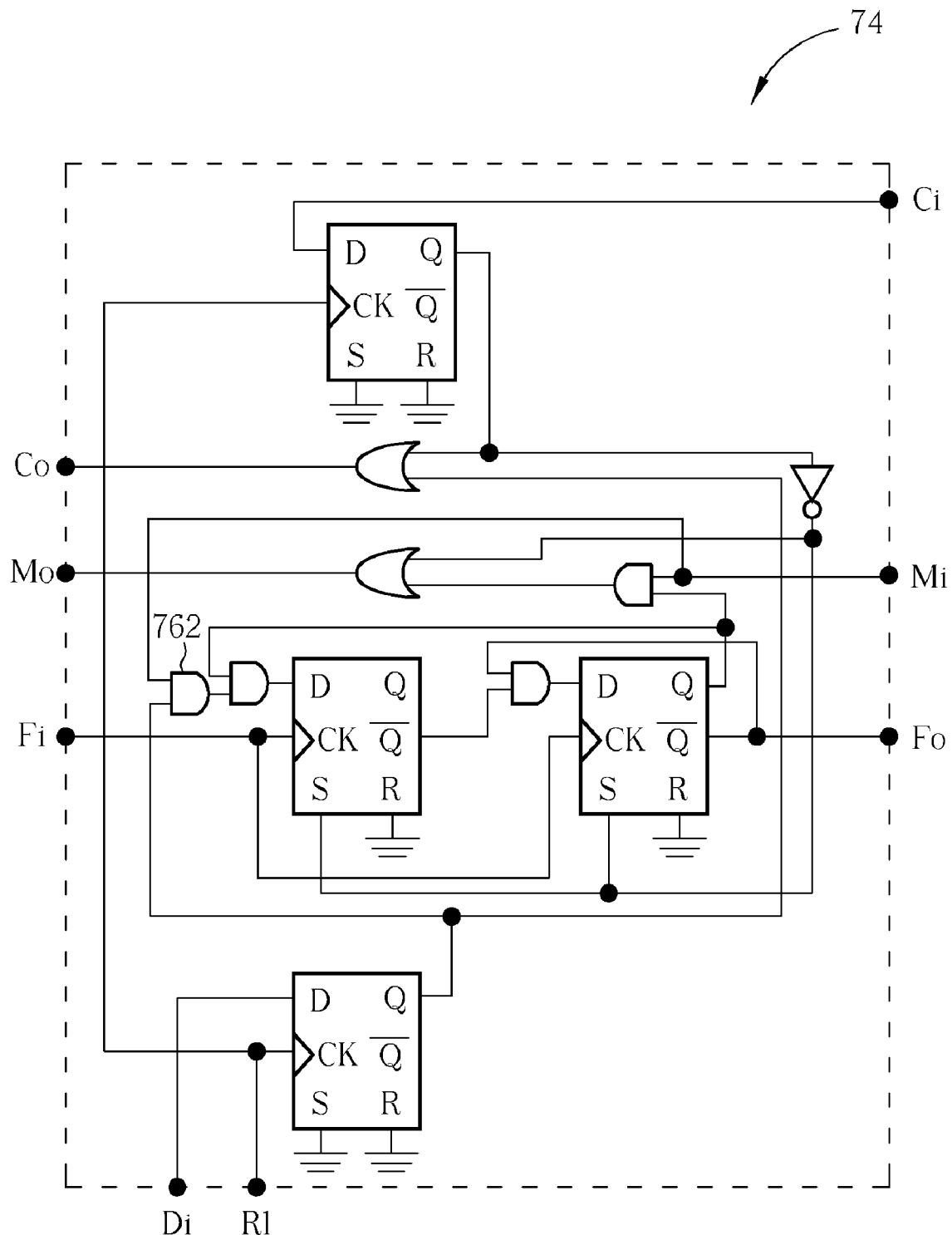
FIG. 21 is another circuit diagram of the cell 70 of FIG. 17.

Please refer to FIG. 20 and FIG. 21, which illustrate a circuit diagram 72 and a circuit diagram 74, respectively, as two embodiments of the cell 70 of FIG. 17. The circuit diagram 72 is very similar with the circuit diagram 74. The only difference is one more AND gate 762 is employed in the circuit diagram 74 to improve the output speed of the second output node (Mo) thereof. Since the logical operation of the circuit diagram 72 is substantially the same as the circuit diagram 74, the circuit diagram 72 is used as an example in following illustrations.

The logical operation of the circuit diagram 72 is similar with the circuit diagram 62 of FIG. 18. In contrast to the circuit diagram 62, the circuit diagram 72 has the fourth input node (Rl), the fifth input node (Ci) and the third output node (Co) but the circuit diagram 62 does not. In this embodiment, the signal 3'-Mo is employed as both the reload signal and the result signal. When the edge (e.g., the raising edge in this embodiment) of the reload signal triggers the fourth input node (Rl), the divisor signal $Di_{<6>}$ on the third input node (Di) and the last divisor signal $Di_{<7>}$ on the fifth input node (Ci) are loaded into the cell 70. If the loaded last divisor signal $Di_{<7>}$ is at logic 0 level, a flip-flop 732 outputs a logic 0 signal. The logic 0 signal is then transferred into a logic 1 signal by a NOT gate 742 to reset flip-flops 734 and 736. Thus, when the last divisor signal $Di_{<7>}$ is at logic 0 level, the cell 70 is bypassed. At that moment, the cell 70 does not perform any dividing operation and can be regarded as being in the reset state.

If the loaded divisor signals $Di_{<6>}$ and $Di_{<7>}$ are both at logic 0 level, an OR gate 752 of the circuit diagram 72 outputs a logic 0 signal from the third output node (Co). The logic 0 signal is transmitted to the fifth input node (Ci) of the previous stage. In other words, when the divisor signals $Di_{<6>}$ and $Di_{<7>}$ loaded to the cell 70 are both at logic 0 level, the cell 70 is bypassed and outputs a logic 0 signal to the fifth input node (Ci) of the fifth stage cell 80.

Figure 22:
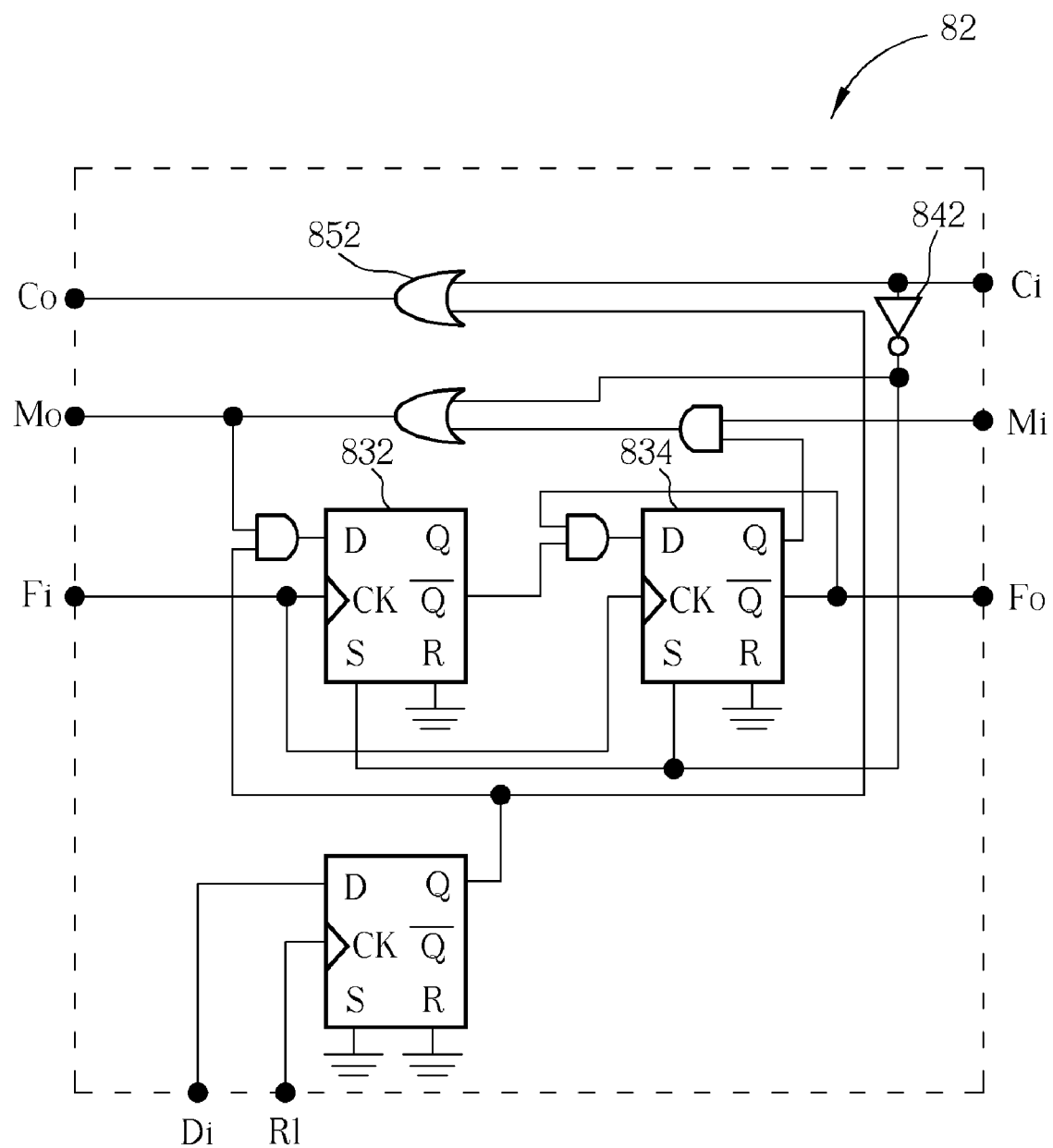
FIG. 22 is a circuit diagram of the cell 80 of FIG. 17.
Figure 23:
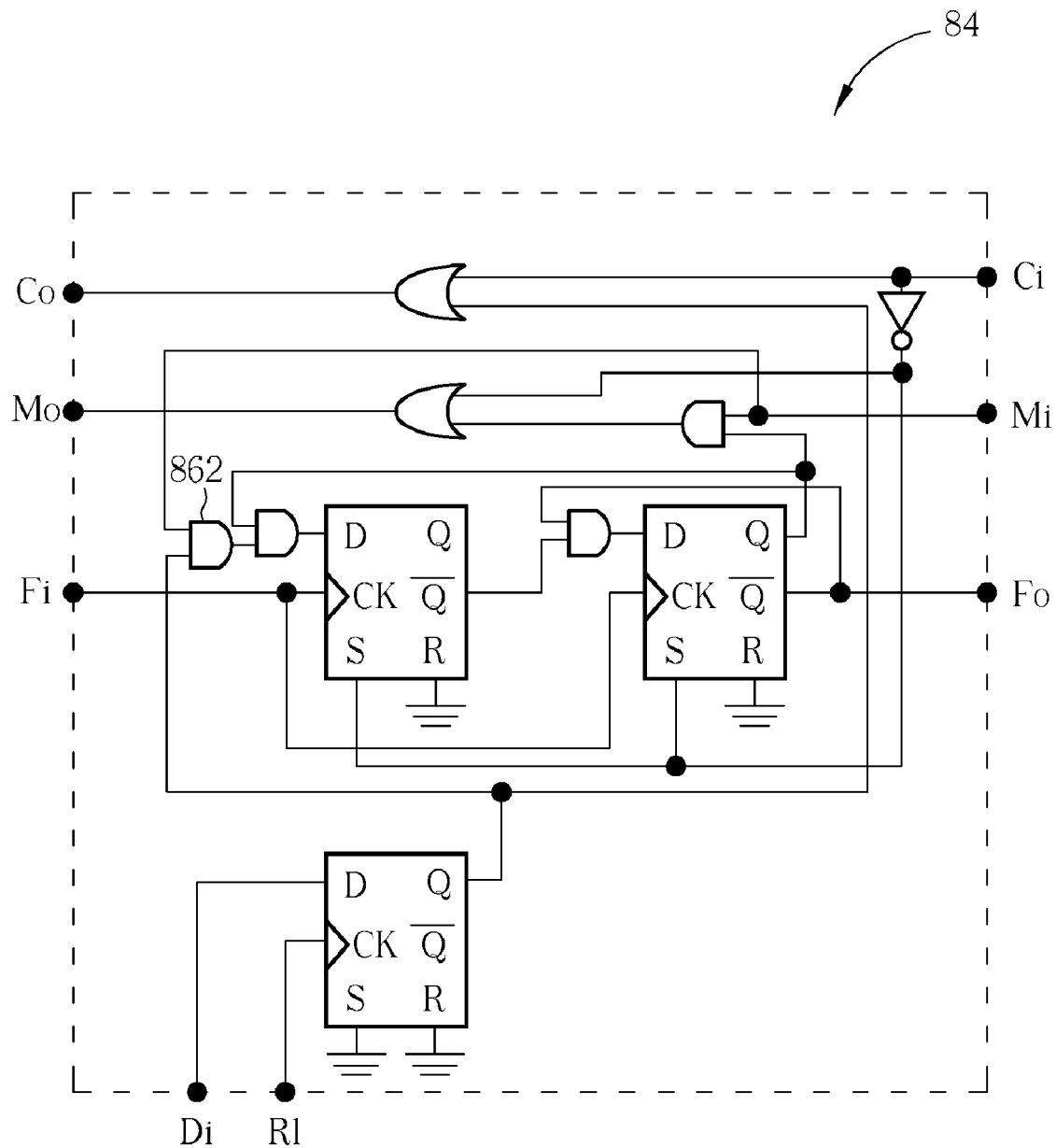
FIG. 23 is another circuit diagram of the cell 80 of FIG. 17.

Please refer to FIG. 22 and FIG. 23, which illustrate a circuit diagram 82 and a circuit diagram 84, respectively, as two embodiments of the cell 80 of FIG. 17. The circuit diagram 82 is very similar with the circuit diagram 84. The only difference is one more AND gate 862 is employed in the circuit diagram 84 to improve the output speed of the second output node (Mo) thereof. Since the logical operation of the circuit diagram 82 is substantially the same as the circuit diagram 84, the circuit diagram 82 is used as an example in the following illustration.

The logical operation of the circuit diagram 82 is similar with the circuit diagram 72 of FIG. 20, but the circuit diagram 82 has one less flip-flop. Similarly, when the edge (e.g., the raising edge in this embodiment) of the reload signal triggers the fourth input node (Rl), the divisor signal $Di_{<5>}$ on the third input node (Di) is loaded into the cell 80. If the signal received on the fifth input node (Ci) is a logic 0 signal, the logic 0 signal is then transferred into a logic 1 signal by a NOT gate 842 to reset flip-flops 832 and 834. Thus, if the received signal of the fifth input node (Ci) is at logic 0 level, the cell 80 is bypassed. At that moment, the cell 80 does not perform any dividing operation and is equivalent to being in the reset state.

At that moment, if the loaded divisor signals $Di_{<5>}$ is also at logic 0 level, an OR gate 852 of the circuit diagram 82 outputs a logic 0 signal from the third output node (Co). The logic 0 signal is transmitted to the fifth input node (Ci) of the previous stage. In other words, when the signal received on the fifth input node (Ci) of the cell 80 and the loaded divisor signals $Di_{<5>}$, from the third input node (Di) are both at logic 0 level, the fifth stage cell 80 is bypassed and simultaneously outputs a logic 0 signal to the fifth input node (Ci) of the fourth stage cell 80 to bypass the fourth stage cell 80.

Regarding the foregoing circuit diagrams 72 and 82, a conclusion is obtained: in the sixth embodiment of the present invention, when the last two loaded divisor signals $Di_{<6>}$, and $Di_{<7>}$ are both at logic 0, the cell 70 and the fifth stage cell 80 of the programmable frequency divider 600 are both bypassed. Furthermore, when the loaded divisor signals $Di_{<5>}$, $Di_{<6>}$ and $Di_{<7>}$ are all at logic 0, the cell 70, the fourth stage cell 80 and the fifth stage cell 80 are bypassed. Thus, the division range of the programmable frequency divider 600 can be extended by programming the divisor signals $Di_{<1>}$, $Di_{<2>}$, $Di_{<3>}$, . . . , and $Di_{<7>}$.

For example, if the sequence of values of the divisor signals $Di_{<7>}$, $Di_{<6>}$, $Di_{<5>}$, . . . , and $Di_{<i>}$ is 0001000, which is the binary value of 8, the divisor value is 8. If the sequence of values of the divisor signals $Di_{<7>}$, $Di_{<6>}$, $Di_{<5>}$, ..., and $Di_{<1>}$ is 0001001, which is the binary value of 9, the divisor value is 9. If the sequence of values of the divisor signals $Di_{<7>}$, $Di_{<6>}$, $Di_{<5>}$, ..., and $Di_{<1>}$ is 0111111, the divisor value is 63. If the sequence of values of the divisor signals $Di_{<7>}$, $Di_{<6>}$, $Di_{<5>}$, ..., and $Di_{<1>}$ is 1000000, the divisor value is 64. If the sequence of values of the divisor signals $Di_{<7>}$, $Di_{<6>}$, $Di_{<5>}$, ..., and $Di_{<1>}$ is 1111111, the divisor value is 127.

In the sixth embodiment shown in FIG. 17, since the last three stages of the programmable frequency divider 600 may be bypassed, the signal, 3-Mo, output from the second output node (Mo) of the third stage cell 60 is employed as the result signal Fout.

An obvious feature of the sixth embodiment of the present invention is that only the cells having the bypass mode, such as cells 70 and 80, have to be synchronously reloaded with the corresponding divisor signal in order to extend the division range and to guarantee the correctness of the frequency of the result signal Fout. Accordingly, the complexity and implementation cost are further reduced.

Note that, six cells employed in the programmable frequency divider 600 is just an example for convenience of illustration. In practical implementation, the number of cells employed in the programmable frequency divider is not necessarily limited to six, and any number of employed cells should also be included in the embodiment.

Figure 24:
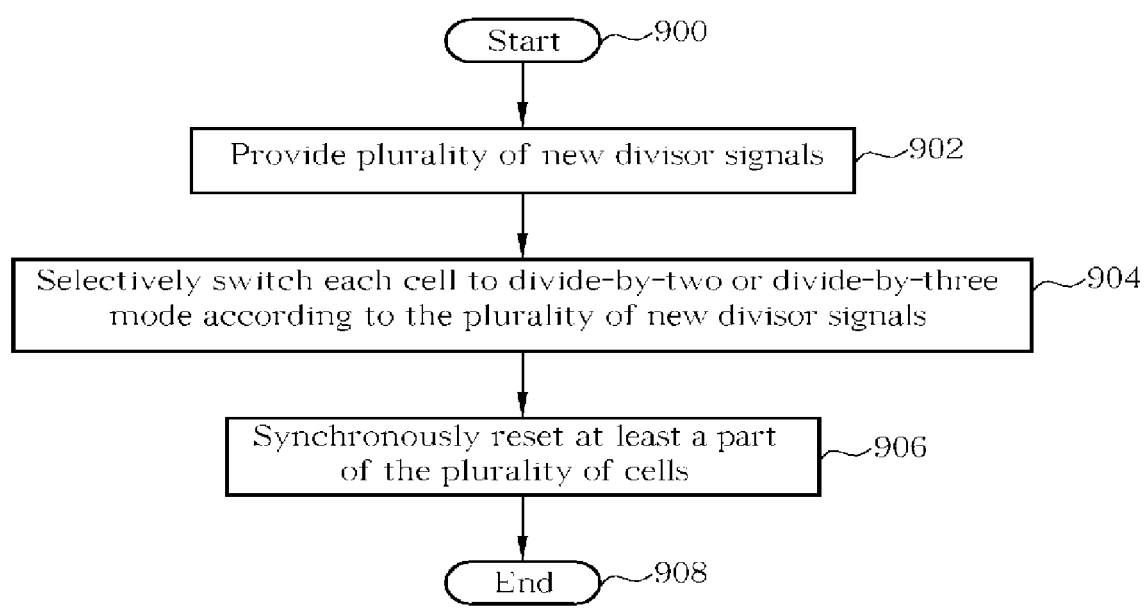
FIG. 24 is a flowchart of changing divisors in a programmable frequency divider according to the present invention.

Please refer to FIG. 24, which depicts a flowchart of the method for changing divisors in a programmable frequency divider comprising a plurality of cascaded cells. The flowchart comprises the following steps:

Step 900: Start.

Step 902: Providing a plurality of divisor signals.

Step 904: Selectively switching each of the plurality of cells to a divide-by-two or a divide-by-three mode according to the plurality of divisor signals.

Step 906: Synchronously resetting at least a part of the plurality of cells.

Step 908: End.

The embodiments shown in FIG. 12 and FIG. 17 are used as examples in the following illustration. In Step 902, a divisor is represented in a binary form. Each bit of the binary divisor is represented as a divisor signal and ready on the third input node (Di) of a corresponding cell. Each cell is then reloaded with the corresponding divisor signal. In the programmable frequency divider 600 of FIG. 17, each cell 60 is loaded with the corresponding divisor signal (such as $Di_{<1>}$, $Di_{<2>}$, or $Di_{<3>}$) when triggered by the rising edge of the working clock, i.e. the signal received on the first input node (Fi). Additionally, each of the cells 80 and cell 70 is loaded with the corresponding divisor signal ($Di_{<4>}$, $Di_{<5>}$, $Di_{<6>}$ or $Di_{<7>}$) when the fourth input node (Rl) triggered by the raising edge of the reload signal. However, in the programmable frequency divider 500 of FIG. 12, each cell is synchronously loaded with a corresponding divisor signal when the fourth input node (Rl) triggered by the rising edge of the reload signal.

In Step 904, each cell switches to a divide-by-two or a divide-by-three mode according to the loaded divisor signal. In the two embodiments of FIG. 12 and FIG. 17, the plurality of divisor signals further determines whether each of the cells having the bypass mode, such as the cell 40, 50, 70, or 80 is bypassed or not. Regarding a cell with the bypass mode, if the divisor signals input to the cell and each of its subsequent cells having the bypass mode are logic 0, the cell is bypassed and does not perform any dividing operation. In addition, the last divisor signal determines whether the last stage, such as the cell 40 or the cell 70, is bypassed or not.

In the programmable frequency divider 600, the fifth stage cell 80 and the cell 70 are assumed bypassed after all the cells are loaded with a corresponding divisor signal. The bypassed cells 80 and 70 are then synchronously reset in Step 906. At that moment, the bypassed cells stop performing the dividing operation. In the programmable frequency divider 500, after all the cells are loaded with a corresponding divisor signal, the fifth stage cell 50 and the cell 40 are assumed bypassed. In Step 906, similarly, the bypassed cells are then synchronously reset. After reset, each of the bypassed cells renews its dividing operation according to the loaded divisor signal.

As mentioned above, after the divisor is changed, each of the bypassed cells of the programmable frequency divider of the present invention stops its dividing operation and each of the cells which is not bypassed renews its dividing operation based on a loaded divisor signal after reset. Accordingly, after the divisor is changed, the frequency of the result signal Fout output from the programmable frequency divider is thereby guaranteed to be the result of the frequency of the source signal Fin divided with the divisor.

In other words, the method for changing divisors of the present invention has the following features: First, the programmable frequency divider of the present invention only needs to utilize simple flip-flops and logic gates to extend the division range instead of employing additional programmable prescaler. Second, in order to guarantee the correctness of the frequency of the output signal, the programmable frequency divider of the present invention resets the dividing cells when changing the divisor value, so that each cell renews operation according to the divisor signal loaded when reset. Third, the programmable frequency divider of the present invention is capable of generating the result signal with continuous pulses by both synchronously resetting each cell and synchronously reloading each cell with a corresponding divisor signal. Fourth, each of the dividing cells of the programmable frequency divider is modularized, so that the cost and complexity of the circuit implementation is thereby effectively reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for changing a selectable divisor in a programmable frequency divider, the frequency divider comprising a plurality of cascaded cells, the method comprising:
   (a) providing a plurality of divisor signals;
   (b) selectively switching each of the plurality of cells to a divide-by-two or a divide-by-three mode according to the plurality of divisor signals; and
   (c) synchronously resetting at least a part of the plurality of cells in response to a reset signal by returning each cell into a predetermined respective state.

2. The method of claim 1, wherein step (c) further comprises synchronously resetting all of the plurality of cells.

3. The method of claim 1, wherein the method further comprises step (d):
   reloading the plurality of divisor signals to the plurality of cells in response to a reload signal.

4. The method of claim 3, wherein step (d) further comprises synchronously reloading the plurality of divisor signals to the plurality of cells.

5. The method of claim 3, wherein the plurality of cells comprises at least one cell having a bypass mode, the method further comprising:
- determining whether to bypass at least a part of the at least one cell having a bypass mode according to the plurality of divisor signals in order to inhibit bypassed cells from performing a frequency-dividing operation.

6. The method of claim 5, wherein step (d) further comprises synchronously resetting each bypassed cell.

7. The method of claim 5, wherein step (d) further comprises synchronously resetting the plurality of cells.

8. The method of claim 5, wherein the reloading step further comprises synchronously reloading the corresponding divisor signals to the bypassed cells.

9. The method of claim 5, wherein the reloading step further comprises synchronously reloading the plurality of divisor signals to the plurality of cells.

10. The method of claim 5, further comprising:
- utilizing a control circuit coupled to the bypassed cells for providing a reset signal.

11. The method of claim 5, further comprising:
- utilizing a control circuit coupled to each of the plurality of cells for providing a reset signal.

12. The method of claim 11, wherein step (d) further comprises utilizing the control circuit to output the reset signal to the bypassed cells and a cell having a bypass mode which is prior to the bypassed cells, the reset signal being output after the bypassed cells are loaded with the corresponding divisor signals.

13. The method of claim 5, wherein step (d) further comprises bypassing a cell having a bypass mode when divisor signals input to the cell and each of its subsequent cells having a bypass mode are logic 0.

14. A programmable frequency divider for dividing the frequency of a source signal according to a selectable divisor which is obtained based on a plurality of divisor signals and outputting a result signal having a divided frequency, the programmable frequency divider comprising:
- at least one cell of a first type being switchable between divide-by-two and divide-by-three modes having a first input node (Fi), a second input node (Mi), a third input node (Di), a fourth input node (Rs), a first output node (Fo), and a second output node (Mo), the third input node (Di) being used for receiving a corresponding divisor signal, the fourth input node (Rs) being used for receiving a reset signal from a control circuit to synchronously reset the cell of the first type;
- wherein if the programmable frequency divider comprising a plurality of cells of the first type, the cells of the first type being cascaded with each other, the first output node (Fo) being coupled to a first input node (Fi) of a subsequent cell of the first type, the second input node (Mi) being coupled to a second output node (Mo) of the subsequent cell of the first type, a first input node (Fi) of a first cell of the first type being coupled to the source signal, and a second input node (Mi) of a last cell of the first type being set to logic 1; the programmable frequency divider synchronously resets all of the cells of the first type according to the reset signal in order to selectively switch each cell of the first type to perform a divide-by-two or divide-by-three operation according to the respective divisor signal after the cell is reset, and the second output node (Mo) or the first output node (Fo) of the last cell of the first type outputs the result signal having the divided frequency.

15. The programmable frequency divider of claim 14 wherein each cell of the first type operates such that:
- (a) regardless of the logic level of the second input node (Mi), if the first output node (Fo) and the third input node (Di) are both at logic 0, the positive edge of a clock signal of the first input node (Fi) triggers the first output node (Fo) to output a half frequency signal;
- (b) if the second input node (Mi) and the third input node (Di) are both at logic 1 and the first output node (Fo) is at logic 0, the positive edge of the clock signal of the first input node (Fi) triggers the first output node (Fo) to output a one-third-frequency signal;
- (c) if the first output node (Fo) is at logic 0, the second output node (Mo) outputs a signal at the same logic level as the second input node (Mi);
- (d) regardless of the logic level of the second input node (Mi), if the first output node (Fo) is at logic 1, the second output node (Mo) outputs a logic 0 signal; and
- (e) if the reset signal received on the fourth input node (Rs) is enabled, the first output node (Fo) outputs a logic 0 signal and, additionally, if the second input node (Mi) is at logic 1, the second output node (Mo) outputs a logic 1 signal.

16. The programmable frequency divider of claim 14 wherein each cell of the first type operates such that:
- (a) regardless of the logic level of the second output node (Mo), if the third input node (Di) is at logic 0, the positive edge of a clock signal of the first input node (Fi) triggers the first output node (Fo) to output a half frequency signal;
- (b) if the second output node (Mo) and the third input node (Di) are both at logic 1, the positive edge of the clock signal of the first input node (Fi) triggers the first output node (Fo) to output a one-third-frequency signal;
- (c) if the first output node (Fo) is at logic 0, the second output node (Mo) outputs a signal at the same logic level as second input node (Mi);
- (d) regardless of the logic level of the second input node (Mi), if the first output node (Fo) is at logic 1, the second output node (Mo) outputs a logic 0 signal; and
- (e) if the reset signal received in the fourth input node (Rs) is enabled, the first output node (Fo) outputs a logic 0 signal; and, additionally, if the second input node (Mi) is at logic 1, the second output node (Mo) outputs a logic 1 signal.

17. The programmable frequency divider of claim 14 further comprising:
- a cell of a second type having a bypass mode and being cascaded to the last cell of the first type, the cell of the second type having a first input node (Fi), a second input node (Mi), a third input node (Di), a fourth input node (Rs), a fifth input node (Ci), a first output node (Fo), a second output node (Mo), and a third output node (Co), the first input node (Fi) being coupled to a first output node (Fo) of the last cell of the first type, the second input node (Mi) being coupled to Vcc, the third input node (Di) being used for receiving a corresponding divisor signal, the fourth input node (Rs) being used for receiving the reset signal to synchronously reset the second cell, the fifth input node (Ci) being used for receiving the last divisor signal, and the second output node (Mo) being coupled to a second input node (Mi) of the last cell of the first type;
- wherein the cell of the second type switches to the divide-by-two or the divide-by-three mode according to the divisor signal received on the third input node (Di) after being synchronously reset, and if the last divisor signal received on the fifth input node (Ci) is at a bypass-mode active state, the cell of the second type switches to a bypass mode.

18. The programmable frequency divider of claim 17 wherein each cell of the second type operates such that:
   (a) regardless of the logic level of the second input node (Mi) or the second output node (Mo), if the first output node (Fo) and the third input node (Di) are both at logic 0, the positive edge of a clock signal of the first input node (Fi) triggers the first output node (Fo) to output a half frequency signal;
   (b) if the first output node (Fo) is at logic 0, the second input node (Mi) is at logic 1 (or if the second output node (Mo) is at logic 1), and the third input node (Di) is at logic 1, the positive edge of the clock signal of the first input node (Fi) triggers the first output node (Fo) to output a one-third-frequency signal;
   (c) if the first output node (Fo) is at logic 0, the second output node (Mo) outputs a signal at the same logic level as the second input node (Mi);
   (d) regardless of the logic level of the second input node (Mi), if the first output node (Fo) is at logic 1, the second output node (Mo) outputs a logic 0 signal;
   (e) if the reset signal received on the fourth input node (Rs) is enabled, the first output node (Fo) outputs a logic 0 signal and the second output node (Mo) outputs a logic 1 signal; and
   (f) if the signal received on the fifth input node (Ci) is at an active state, the first output node (Fo) outputs a logic 0 signal and the second output node (Mo) outputs a logic 1 signal.

19. The programmable frequency divider of claim 17 further comprising:
   at least one cell of a third type having a bypass mode and being cascaded between at least one cell of the first type and the cell of the second type, each cell of the third type having a first input node (Fi), a second input node (Mi), a third input node (Di), a fourth input node (Rs), a fifth input node (Ci), a first output node (Fo), a second output node (Mo), and a third output node (Co), the first output node (Fo) being coupled to a first input node (Fi) of a subsequent cell, the second input node (Mi) being coupled to a second output node (Mo) of the subsequent cell of the third type, the third input node (Di) being used for receiving a corresponding divisor signal, the fourth input node (Rs) being used for receiving the reset signal to synchronously reset the third cell, the fifth input node (Ci) being coupled to a third output node (Co) of the subsequent cell and being used for receiving a bypass-mode enabling signal, a first input node (Fi) of a first cell of the third type being coupled to a first output node (Fo) of the last cell of the first type, a second output node (Mo) of the first cell of the third type being coupled to the second input node (Mi) of the last cell of the first type, a first output node (Fo) of a last cell of the third type being coupled to the first input node (Fi) of the cell of the second type, a second input node (Mi) of the last cell of the third type being coupled to the second output node (Mo) of the cell of the second type;
   wherein each cell of the third type switches to a divide-by-two or divide-by-three mode according to the divisor signal received on the third input node (Di), and if the bypass-mode enabling signal received on the fifth input node (Ci) is at an active state, the cell of the third type switches to a bypass mode.

20. The programmable frequency divider of claim 19 wherein each cell of the third type operates such that:
   (a) regardless of the logic level of the second input node (Mi) or the second output node (Mo), if the first output node (Fo) and the third input node (Di) are both at logic 0, the positive edge of a clock signal of the first input node (Fi) triggers the first output node (Fo) to output a half frequency signal;
   (b) if the first output node (Fo) is at logic 0, the second input node (Mi) is at logic 1 (or if the second output node (Mo) is at logic 1), and the third input node (Di) is at logic 1, the positive edge of a clock signal of the first input node (Fi) triggers the first output node (Fo) to output a one-third-frequency signal;
   (c) if the first output node (Fo) is at logic 0, the second output node (Mo) outputs a signal at the same logic level as the second input node (Mi);
   (d) regardless of the logic level of the second input node (Mi), if the first output node (Fo) is at logic 1, the second output node (Mo) outputs a logic 0 signal;
   (e) if the reset signal received on the fourth input node (Rs) is enabled, the first output node (Fo) outputs a logic 0 signal and the second output node (Mo) outputs a logic 1 signal; and
   (f) if the bypass-mode enabling signal received on the fifth input node (Ci) is at an active state, the first output node (Fo) outputs a logic 0 signal and the second output node (Mo) outputs a logic 1 signal.

21. The programmable frequency divider of claim 14 further comprising a control circuit for providing the reset signal.

22. A programmable frequency divider for dividing the frequency of a source signal according to a selectable divisor which is obtained based on a plurality of divisor signals and outputting a result signal having a divided frequency, the programmable frequency divider comprising:
   at least one cell of a fourth type being switchable between divide-by-two and divide-by-three modes having a first input node (Fi), a second input node (Mi), a third input node (Di), a fourth input node (Rl), a first output node (Fo), and a second output node (Mo), the third input node (Di) being used for receiving a corresponding divisor signal, the fourth input node (Rl) being used for receiving a reload signal to synchronously reload the corresponding divisor signal to the third input node (Di);
   wherein if the programmable frequency divider comprising a plurality of cells of the fourth type, the cells of the fourth type being cascaded with each other, the first output node (Fo) being coupled to a first input node (Fi) of a subsequent cell of the fourth type, the second input node (Mi) being coupled to a second output node (Mo) of the subsequent cell of the fourth type, a first input node (Fi) of a first cell of the fourth type being coupled to the source signal, and a second input node (Mi) of a last cell of the fourth type being set to logic 1; the programmable frequency divider synchronously reloads the corresponding divisor signals to the third input node (Di) of each cell of the fourth type according to the reload signal in order to selectively switch each cell of the fourth type to perform a divide-by-two or divide-by-three operation, and the second output node (Mo) or the first output node (Fo) of the last cell of the fourth type outputs the result signal having the divided frequency; and each cell of the fourth type operates such that:
   (a) regardless of the logic level of the second input node (Mi), if the first output node (Fo) is at logic 0 and the third input node (Di) is at logic 0 when the fourth input node (Rl) is triggered by the reload signal, the positive edge of a clock signal of the first input node (Fi) triggers the first output node (Fo) to output a half frequency signal;

(b) if the second input node (Mi) is at logic 1, the first output node (Fo) is at logic 0, and the third input node (Di) is at logic 1 when the fourth input node (Rl) is triggered by the reload signal, the positive edge of a clock signal of the first input node (Fi) triggers the first output node (Fo) to output a one-third-frequency signal;

(c) if the first output node (Fo) is at logic 0, the second output node (Mo) outputs a signal at the same logic level as the second input node (Mi); and (d) regardless of the logic level of the second input node (Mi), if the first output node (Fo) is at logic 1, the second output node (Mo) outputs a logic 0 signal.

23. A programmable frequency divider for dividing the frequency of a source signal according to a selectable divisor which is obtained based on a plurality of divisor signals and outputting a result signal having a divided frequency, the programmable frequency divider comprising:

at least one cell of a fourth type being switchable between divide-by-two and divide-by-three modes having a first input node (Fi), a second input node (Mi), a third input node (Di), a fourth input node (Rl), a first output node (Fo), and a second output node (Mo), the third input node (Di) being used for receiving a corresponding divisor signal, the fourth input node (Rl) being used for receiving a reload signal to synchronously reload the corresponding divisor signal to the third input node (Di);

wherein if the programmable frequency divider comprising a plurality of cells of the fourth type, the cells of the fourth type being cascaded with each other, the first output node (Fo) being coupled to a first input node (Fi) of a subsequent cell of the fourth type, the second input node (Mi) being coupled to a second output node (Mo) of the subsequent cell of the fourth type, a first input node (Fi) of a first cell of the fourth type being coupled to the source signal, and a second input node (Mi) of a last cell of the fourth type being set to logic 1; the programmable frequency divider synchronously reloads the corresponding divisor signals to the third input node (Di) of each cell of the fourth type according to the reload signal in order to selectively switch each cell of the fourth type to perform a divide-by-two or divide-by-three operation, the second output node (Mo) or the first output node (Fo) of the last cell of the fourth type outputs the result signal having the divided frequency; and each cell of the fourth type operates such that:

(a) regardless of the logic level of the second output node (Mo), if the third input node (Di) is at logic 0 when the fourth input node (Rl) is triggered by the reload signal, the positive edge of a clock signal of the first input node (Fi) triggers the first output node (Fo) to output a half frequency signal;

(b) if the second output node (Mo) is at logic 1 and the third input node (Di) is at logic 1 when the fourth input node (Rl) is triggered by the reload signal, the positive edge of a clock signal of the first input node (Fi) triggers the first output node (Fo) to output a one-third-frequency signal;

(c) if the first output node (Fo) is at logic 0, the second output node (Mo) outputs a signal at the same logic level as the second input node (Mi); and (d) regardless of the logic level of the second input node (Mi), if the first output node (Fo) is at logic 1, the second output node (Mo) outputs a logic 0 signal.

24. A programmable frequency divider for dividing the frequency of a source signal according to a selectable divisor which is obtained based on a plurality of divisor signals and outputting a result signal having a divided frequency, the programmable frequency divider comprising:

at least one cell of a fourth type being switchable between divide-by-two and divide-by-three modes having a first input node (Fi), a second input node (Mi), a third input node (Di), a fourth input node (Rl), a first output node (Fo), and a second output node (Mo), the third input node (Di) being used for receiving a corresponding divisor signal, the fourth input node (Rl) being used for receiving a reload signal to synchronously reload the corresponding divisor signal to the third input node (Di), and the fourth input node (Rl) of each cell of the fourth type is being coupled to a second output node (Mo) of the last cell of the fourth type in order to apply the result signal having the divided frequency to be the reload signal;

wherein if the programmable frequency divider comprising a plurality of cells of the fourth type, the cells of the fourth type being cascaded with each other, the first output node (Fo) being coupled to a first input node (Fi) of a subsequent cell of the fourth type, the second input node (Mi) being coupled to a second output node (Mo) of the subsequent cell of the fourth type, a first input node (Fi) of a first cell of the fourth type being coupled to the source signal, and a second input node (Mi) of a last cell of the fourth type being set to logic 1; the programmable frequency divider synchronously reloads the corresponding divisor signals to the third input node (Di) of each cell of the fourth type according to the reload signal in order to selectively switch each cell of the fourth type to perform a divide-by-two or divide-by-three operation, and the second output node (Mo) or the first output node (Fo) of the last cell of the fourth type outputs the result signal having the divided frequency.

25. The programmable frequency divider of claim 24 further comprising:

a cell of a fifth type having a bypass mode and being cascaded to the last cell of the fourth type, the cell of the fifth type having a first input node (Fi), a second input node (Mi), a third input node (Di), a fourth input node (Ri), a fifth input node (Ci), a first output node (Fo), a second output node (Mo), and a third output node (Co), the first input node (Fi) being coupled to a first output node (Fo) of the last cell of the fourth type, the second input node (Mi) being coupled to Vcc, the third input node (Di) being used for receiving a corresponding divisor signal, the fourth input node (Ri) being used for receiving the reload signal to synchronously reload the corresponding divisor signal to the third input node (Di), the fifth input node (Ci) being coupled to the last divisor signal, and the second output node (Mo) being coupled to the second input node (Mi) of the last cell of the fourth type;

wherein the reload signal triggers the cell of the fifth type to synchronously reload the corresponding divisor signal to the third input node (Di) and the cell of the fifth type switches to a divide-by-two or divide-by-three mode according to the divisor signal, and if the last divisor signal received in the fifth input node (Ci) is at a bypass-mode active state, the cell of the fifth type switches to a bypass mode.

26. The programmable frequency divider of claim 25 wherein each cell of the fifth type operates such that:
(a) regardless of the logic level of the second input node (Mi) or the second output node (Mo), if the first output node (Fo) is at logic 0 and the third input node (Di) is at logic 0 when the fourth input node (Rl) is triggered by the reload signal, the positive edge of a clock signal of the first input node (Fi) triggers the first output node (Fo) to output a half frequency signal;
(b) if the first output node (Fo) is at logic 0, the second input node (Mi) is at logic 1 (or if the second output node (Mo) is at logic 1), and the third input node (Di) is at logic 1 when the fourth input node (Rl) is triggered by the reload signal, the positive edge of a clock signal of the first input node (Fi) triggers the first output node (Fo) to output a one-third-frequency signal;
(c) if the first output node (Fo) is at logic 0, the second output node (Mo) outputs a signal at the same logic level as the second input node (Mi);
(d) regardless of the logic level of the second input node (Mi), if the first output node (Fo) is at logic 1, the second output node (Mob outputs a logic 0 signal; and
(e) if the signal received in the fifth input node (Ci) is at an active state, the first output node (Fo) outputs a logic 0 signal and the second output node (Mo) outputs a logic 1 signal.

27. The programmable frequency divider of claim 25, wherein the fourth input node (Rl) of the cell of the fifth type is coupled to the second output node (Mo) of the last cell of the fourth type in order to apply the result signal having the divided frequency to be the reload signal.

28. The programmable frequency divider of claim 25, further comprising:
at least one cell of a sixth type having a bypass mode and being cascaded between at least one cell of the fourth type and the cell of the fifth type, each cell of the sixth type having a first input node (Fi), a second input node (Mi), a third input node (Di), a fourth input node (Rl), a fifth input node (Ci), a first output node (Fo), a second output node (Mo), and a third output node (Co), the first output node (Fo) being coupled to a first input node (Fi) of a subsequent cell, the second input node (Mi) being coupled to a second output node (Mo) of the subsequent cell, the third input node (Di) being used for receiving a corresponding divisor signal, the fourth input node (Rl) being used for receiving the reload signal to synchronously reload the the corresponding divisor signal to the third input node (Di), the fifth input node (Ci) being coupled to a third output node (Co) of the subsequent cell and being used for receiving a bypass-mode enabling signal, a first input node (Fi) of a first cell of the sixth type being coupled to the first output node (Fo) of the last cell of the fourth type, a second output node (Mo) of the first cell of the sixth type being coupled to the second input node (Mi) of the last cell of the fourth type, a first output node (Fo) of a last cell of the sixth type being coupled to the first input node (Fi) of the cell of the fifth type, and a second input node (Mi) of the last cell of the sixth type being coupled to the second output node (Mo) of the cell of the fifth type;
wherein the reload signal triggers the at least one cell of the sixth type to synchronously reload the corresponding divisor signal to the third input node (Di) and each cell of the sixth type switches to a divide-by-two or divide-by-three mode according to the repective divisor signal, and if the bypass-mode enabling signal received in the fifth input node (Ci) is at an active state, the cell of the sixth type switches to a bypass mode.

29. The programmable frequency divider of claim 28, wherein each cell of the sixth type operates such that:
(a) regardless of the logic level of the second input node (Mi) or the second output node (Mo), if the first output node (Fo) is at logic 0 and the third input node (Di) is at logic 0 when the fourth input node (Rl) is triggered by the reload signal, the positive edge of a clock signal of the first input node (Fi) triggers the first output node (Fo) to output a half frequency signal;
(b) if the first output node (Fo) is at logic 0, the second input node (Mi) is at logic 1 (or if the second output node (Mo) is at logic 1), and the third input node (Di) is at logic 1 when the fourth input node (Rl) is triggered by the reload signal, the positive edge of a clock signal of the first input node (Fi) triggers the first output node (Fo) to output a one-third-frequency signal;
(c) if the first output node (Fo) is at logic 0, the second output node (Mo) outputs a signal having the same logic level as the second input node (Mi);
(d) regardless of the logic level of the second input node (Mi), if the first output node (Fo) is at logic 1, the second output node (Mo) outputs a logic 0 signal; and
(e) if the bypass-mode enabling signal received on the fifth input node (Ci) is at an active state, the first output node (Fo) outputs a logic 0 signal and the second output node (Mo) outputs a logic 1 signal.

30. The programmable frequency divider of claim 28, wherein the fourth input node (Rl) of each cell of the sixth type is coupled to the second output node (Mo) of the last cell of the fourth type in order to apply the result signal having the divided frequency to be the reload signal.

31. A programmable frequency divider for dividing the frequency of a source signal according to a selectable divisor which is obtained based on a plurality of divisor signals and outputting a result signal having a divided frequency, the programmable frequency divider comprising:
at least one cell of a seventh type being switchable between divide-by-two and divide-by-three modes having a first input node (Fi), a second input node (Mi), a third input node (Di), a fourth input node (Rs), a fifth input node (Rl), a first output node (Fo), and a second output node (Mo), the third input node (Di) being used for receiving a corresponding divisor signal, the fourth input node (Rs) being used for receiving a reset signal to synchronously reset the cell of the seventh type, the fifth input node (Rl) being used for receiving a reload signal to synchronously reload the corresponding divisor signal to the third input node (Di);
wherein if the programmable frequency divider comprising a plurality of cells of the seventh type, the cells of the seventh type being cascaded with each other and each cell of the seventh type, the first output node (Fo) being coupled to a first input node (Fi) of a subsequent cell of the seventh type, the second input node (Mi) being coupled to a second output node (Mo) of the subsequent cell of the seventh type, a first input node (Fi) of a first cell of the seventh type being coupled to the source signal, and a second input node (Mi) of a last cell of the seventh type being set to logic 1; the programmable frequency divider reloads the corresponding divisor signal to the third input node (Di) of each cell of the seventh type according to the reload signal and resets each cell of the seventh type according to the reset signal in order to selectively switch each cell of the seven type to perform a divide-by-two or divide-by-three operation according to the respective divisor signal loaded before reset, and the second output node (Mo) or the first output node (Fo) of the last cell of the seventh type outputs the result signal having the divided frequency.

32. The programmable frequency divider of claim 31, wherein each cell of the seventh type operates such that:
(a) regardless of the logic level of the second input node (Mi), if the first output node (Fo) is at logic 0 and the third input node (Di) is at logic 0 when the fifth input node (Rl) is triggered by the reload signal, the positive edge of a clock signal of the first input node (Fi) triggers the first output node (Fo) to output a half frequency signal;
(b) if the second input node (Mi) is at logic 1, the first output node (Fo) is at logic 0, and the third input node (Di) is at logic 1 when the fifth input node (Rl) is triggered by the reload signal, the positive edge of the clock signal of the first input node (Fi) triggers the first output node (Fo) to output a one-third-frequency signal;
(c) if the first output node (Fo) is at logic 0, the second output node (Mo) outputs a signal at the same logic level as the second input node (Mi);
(d) regardless of the logic level of the second input node (Mi), if the first output node (Fo) is at logic 1, the second output node (Mo) outputs a logic 0 signal; and
(e) if the reset signal received on the fourth input node (Rs) is at logic 1, the first output node (Fo) outputs a logic 0 signal;
and, additionally, if the second input node (Mi) is also at logic 1, the second output node (Mo) outputs a logic 1 signal.

33. The programmable frequency divider of claim 31, wherein each cell of the seventh type operates such that:
(a) regardless of the logic level of the second output node (Mo), if the third input node (Di) is at logic 0 when the fifth input node (Rl) is triggered by the reload signal, the positive edge of a clock signal of the first input node (Fi) triggers the first output node (Fo) to output a half frequency signal;
(b) if the second output node (Mo) is at logic 1 and the third input node (Di) is at logic 1 when the fifth input node (Rl) is triggered by the reload signal, the positive edge of the clock signal of the first input node (Fi) triggers the first output node (Fo) to output a one-third-frequency signal;
(c) if the first output node (Fo) is at logic 0, the second output node (Mo) outputs a signal at the same logic signal as the second input node (Mi);
(d) regardless of the logic level of the second input node (Mi), if the first output node (Fo) is at logic 1, the second output node (Mo) outputs a logic 0 signal; and
(e) if the reset signal received on the fourth input node (Rs) is enabled, the first output node (Fo) outputs a logic 0 signal; and, additionally, if the second input node (Mi) is also at logic 1, the second output node (Mo) outputs a logic 1 signal.

34. The programmable frequency divider of claim 31, wherein the fifth input node (Rl) of each cell of the seventh type is coupled to the second output node (Mo) of the last cell of the seventh type in order to apply the result signal to be the reload signal.

35. The programmable frequency divider of claim 31, further comprising a control circuit for providing the reset signal.

36. The programmable frequency divider of claim 31, further comprising:
a cell of an eighth type having a bypass mode and being cascaded to the last cell of the seventh type, the cell of the eighth type having a first input node (Fi), a second input node (Mi), a third input node (Di), a fourth input node (Rs), a fifth input node (Rl), a sixth input node (Ci), a first output node (Fo), a second output node (Mo), and a third output node (Co), the first input node (Fi) being coupled to a first output node (Fo) of the last cell of the seventh type, the second input node (Mi) being coupled to Vcc, the third input node (Di) being used for receiving a corresponding divisor signal, the fourth input node (Rs) being used for receiving the reset signal to reset the cell of the eighth type, the fifth input node (Rl) being used for receiving the reload signal to synchronously reload the corresponding divisor signal to the third input node (Di), the sixth input node (Ci) being coupled to the last divisor signal, and the second output node (Mo) being coupled to the second input node (Mi) of the last cell of the seventh type;
wherein the reload signal triggers the cell of the eighth type to synchronously reload the corresponding divisor signal to the third input node (Di) and the cell of the eighth type switches to a divide-by-two or a divide-by-three mode after being synchronously reset according to the divisor signal, and if the last divisor signal received on the sixth input node (Ci) is at a bypass-mode active state, the cell of the eighth type switches to a bypass mode.

37. The programmable frequency divider of claim 36, wherein each cell of the eighth type operates such that:
(a) regardless of the logic level of the second input node (Mi) or the second output node (Mo), if the first output node (Fo) is at logic 0, and the third input node (Di) is at logic 0 when the fifth input node (Rl) is triggered by the reload signal, the positive edge of a clock signal of the first input node (Fi) triggers the first output node (Fo) to output a half frequency signal;
(b) if the first output node (Fo) is at logic 0, the second input node (Mi) is at logic 1 (or if the second output node (Mo) is at logic 1), and the third input node (Di) is at logic 1 when the fifth input node (Rl) is triggered by the reload signal, the positive edge of a clock signal of the first input node (Fi) triggers the first output node (Fo) to output a one-third-frequency signal;
(c) if the first output node (Fo) is at logic 0, the second output node (Mo) outputs a signal at the same logic level as the second input node (Mi);
(d) regardless of the logic level of the second input node (Mi), if the first output node (Fo) is at logic 1, the second output node (Mo) outputs a logic 0 signal;
(e) if the reset signal received on the fourth input node (Rs) is enabled, the first output node (Fo) outputs a logic 0 signal and the second output node (Mo) outputs a logic 1 signal; and
(f) if the signal received on the sixth input node (Ci) is at an active state, the first output node (Fo) outputs a logic 0 signal and the second output node (Mo) outputs a logic 1 signal.

38. The programmable frequency divider of claim 36, wherein the fifth input node (Rl) is coupled to the second output node (Mo) of the last cell of the seventh type in order to apply the result signal to be the reload signal.

39. The programmable frequency divider of claim 36, further comprising:

at least one cell of a ninth type having a bypass mode and being cascaded between at least one cell of the seventh type and the cell of the eighth type, each cell of the ninth type having a first input node (Fi), a second input node (Mi), a third input node (Di), a fourth input node (Rs), a fifth input node (Rl), a sixth input node (Ci), a first output node (Fo), a second output node (Mo), and a third output node (Co), the first output node (Fo) being coupled to a first input node (Fi) of a subsequent cell of the ninth type, the second input node (Mi) being coupled to a second output node (Mo) of the subsequent cell, the third input node (Di) being used for receiving a corresponding divisor signal, the fourth input node (Rs) being used for receiving the reset signal to synchronously reset the cell of the ninth type, the fifth input node (Rl) being used for receiving the reload signal to synchronously reload the corresponding divisor signal to the third input node (Di), the sixth input node (Ci) being coupled to a third output node (Co) of the subsequent cell and being used for receiving a bypass-mode enabling signal, a first input node (Fi) of a first cell of the ninth type being coupled to the first output node (Fo) of the last cell of the seventh type, a second output node (Mo) of the first cell of the ninth type being coupled to the second input node (Mi) of the last cell of the seventh type, a first output node (Fo) of a last cell of the ninth type being coupled to the first input node (Fi) of the cell of the eighth type, and a second input node (Mi) of the last cell of the ninth type being coupled to the second output node (Mo) of the cell of the eighth type;

wherein the reload signal triggers the at least one cell of the ninth type to synchronously reload the corresponding divisor signal to the third input node (Di) and each cell of the ninth type switches to a divide-by-two or divide-by-three mode after being synchronously reset according to the respective divisor signal, and if the bypass-mode enabling signal received on the sixth input node (Ci) is at an active state, the cell of the ninth type switches to a bypass mode.

40. The programmable frequency divider of claim 39, wherein each cell of the ninth type operates such that:

(a) regardless of the logic level of the second input node (Mi) or the second output node (Mo), if the first output node (Fo) is at logic 0 and the third input node (Di) is at logic 0 when the fifth input node (Rl) is triggered by the reload signal, the positive edge of a clock signal of the first input node (Fi) triggers the first output node (Fo) to output a half frequency signal;

(b) if the first output node (Fo) is at logic 0, the second input node (Mi) is at logic 1 (or if the second output node (Mo) is at logic 1), and the third input node (Di) is at logic 1 when the fifth input node (Rl) triggered by the reload signal, the positive edge of a clock signal of the first input node (Fi) triggers the first output node (Fo) to output a one-third-frequency signal;

(c) if the first output node (Fo) is at logic 0, the second output node (Mo) outputs a signal at the same logic level as the second input node (Mi);

(d) regardless of the logic level of the second input node (Mi), if the first output node (Fo) is at logic 1, the second output node (Mo) outputs a logic 0 signal;

(e) if the reset signal received on the fourth input node (Rs) is enabled, the first output node (Fo) outputs a logic 0 signal; and, additionally, if the second input node (Mi) is also at logic 1, the second output node (Mo) outputs a logic 1 signal; and (f) if the bypass-mode enabling signal received on the sixth input node (Ci) is at an active state, the first output node (Fo) outputs a logic 0 signal and the second output node (Mo) outputs a logic 1 signal.

41. The programmable frequency divider of claim 39, wherein the fifth input node (Rl) of each cell of the ninth type is coupled to the second output node (Mo) of the last cell of the seventh type in order to apply the result signal to be the reload signal.

42. A programmable frequency divider for dividing frequency of a source signal according to a selectable divisor which is obtained based on a plurality of divisor signals and outputting a result signal having a divided frequency, the programmable frequency divider comprising:

at least one cell of a tenth type being switchable between divide-by-two and divide-by-three modes having a first input node (Fi), a second input node (Mi), a third input node (Di), a first output node (Fo), and a second output node (Mo), the third input node (Di) being used for receiving a corresponding divisor signal, and the first input node (Fi) of a first cell of the tenth type being coupled to the source signal; and a cell of an eleventh type having a first input node (Fi), a second input node (Mi), a third input node (Di), a fourth input node (Rl), a fifth input node (Ci), a first output node (Fo), a second output node (Mo), and a third output node (Co), the first input node (Fi) being coupled to a first output node (Fo) of a last cell of the tenth type, the second input node (Mi) being set to logic 1, the third input node (Di) being used for receiving a corresponding divisor signal, the fourth input node (Rl) being used for receiving a reload signal to synchronously reload the corresponding divisor signal to the third input node (Di), the fifth input node (Ci) being coupled to a last divisor signal, and the second output node (Mo) being coupled to a second input node (Mi) of the last cell of the tenth type;

wherein if the programmable frequency divider comprising a plurality of cells of the tenth type, the cells of the tenth type being cascaded with each other and each cell of the tenth type, the first output node (Fo) being coupled to a first input node (Fi) of a subsequent cell of the tenth type, the second input node (Mi) being coupled to a second output node (Mo) of the subsequent cell of the tenth type; the programmable frequency divider selectively switches each cell to a divide-by-two or a divide-by-three mode according to the respective divisor signal, the reload signal triggers the third input node (Di) of the cell of the eleventh type to reload the corresponding divisor signal, if the last divisor signal received in the fifth input node (Ci) of the cell of the eleven type is at a bypass-mode active state, the cell of the eleventh type switches to a bypass mode, and the second output node (Mo) or the first output node (Fo) of the last cell of the tenth type outputs the result signal having the divided frequency; each cell of the tenth type operates such that:

(a) regardless of the logic level of the second input node (Mi), if the first output node (Fo) is at logic 0 and the third input node (Di) is at logic 0, the positive edge of a clock signal of the first input node (Fi) triggers the first output node (Fo) to output a half frequency signal;

(b) if the second input node (Mi) is at logic 1, the first output node (Fo) is at logic 0, and the third input node (Di) is at logic 1, the positive edge of a clock signal of the first input node (Fi) triggers the first output node (Fo) to output a one-third-frequency signal;

(c) if the first output node (Fo) is at logic 0, the second output node (Mo) outputs a signal at the same logic level as the second input node (Mi); and (d) regardless of the logic level of the second input node (Mi), if the first output node (Fo) is at logic 1, the second output node (Mo) outputs a logic 0 signal.

43. A programmable frequency divider for dividing frequency of a source signal according to a selectable divisor which is obtained based on a plurality of divisor signals and outputting a result signal having a divided frequency, the programmable frequency divider comprising:

at least one cell of a tenth type being switchable between divide-by-two and divide-by-three modes having a first input node (Fi), a second input node (Mi), a third input node (Di), a first output node (Fo), and a second output node (Mo), the third input node (Di) being used for receiving a corresponding divisor signal, and the first input node (Fi) of a first cell of the tenth type being coupled to the source signal; and a cell of an eleventh type having a first input node (Fi), a second input node (Mi), a third input node (Di), a fourth input node (Rl), a fifth input node (Ci), a first output node (Fo), a second output node (Mo), and a third output node (Co), the first input node (Fi) being coupled to a first output node (Fo) of a last cell of the tenth type, the second input node (Mi) being set to logic 1, the third input node (Di) being used for receiving a corresponding divisor signal, the fourth input node (Rl) being used for receiving a reload signal to synchronously reload the corresponding divisor signal to the third input node (Di), the fifth input node (Ci) being coupled to a last divisor signal, and the second output node (Mo) being coupled to a second input node (Mi) of the last cell of the tenth type;

wherein if the programmable frequency divider comprising a plurality of cells of the tenth type, the cells of the tenth type being cascaded with each other and each cell of the tenth type, the first output node (Fo) being coupled to a first input node (Fi) of a subsequent cell of the tenth type, the second input node (Mi) being coupled to a second output node (Mo) of the subsequent cell of the tenth type; the programmable frequency divider selectively switches each cell to a divide-by-two or a divide-by-three mode according to the respective divisor signal, the reload signal triggers the third input node (Di) of the cell of the eleventh type to reload the corresponding divisor signal, if the last divisor signal received in the fifth input node (Ci) of the cell of the eleven type is at a bypass-mode active state, the cell of the eleventh type switches to a bypass mode, and the second output node (Mo) or the first output node (Fo) of the last cell of the tenth type outputs the result signal having the divided frequency; each cell of the tenth type operates such that:

(a) regardless of the logic level of the second output node (Mo), if the third input node (Di) is at logic 0, the positive edge of a clock signal of the first input node (Fi) triggers the first output node (Fo) to output a half frequency signal;

(b) if the second output node (Mo) and the third input node (Di) are both at logic 1, the positive edge of the clock signal of the first input node (Fi) triggers the first output node (Fo) to output a one-third-frequency signal;

(c) if the first output node (Fo) is at logic 0, the second output node (Mo) outputs a signal at the same logic level as the second input node (Mi); and (d) regardless of the logic level of the second input node (Mi), if the first output node (Fo) is at logic 1, the second output node (Mo) outputs a logic 0 signal.

44. A programmable frequency divider for dividing frequency of a source signal according to a selectable divisor which is obtained based on a plurality of divisor signals and outputting a result signal having a divided frequency, the programmable frequency divider comprising:

at least one cell of a tenth type being switchable between divide-by-two and divide-by-three modes having a first input node (Fi), a second input node (Mi), a third input node (Di), a first output node (Fo), and a second output node (Mo), the third input node (Di) being used for receiving a corresponding divisor signal, and the first input node (Fi) of a first cell of the tenth type being coupled to the source signal; and a cell of an eleventh type having a first input node (Fi), a second input node (Mi), a third input node (Di), a fourth input node (Rl), a fifth input node (Ci), a first output node (Fo), a second output node (Mo), and a third output node (Co), the first input node (Fi) being coupled to a first output node (Fo) of a last cell of the tenth type, the second input node (Mi) being set to logic 1, the third input node (Di) being used for receiving a corresponding divisor signal, the fourth input node (Rl) being used for receiving a reload signal to synchronously reload the corresponding divisor signal to the third input node (Di), the fifth input node (Ci) being coupled to a last divisor signal, and the second output node (Mo) being coupled to a second input node (Mi) of the last cell of the tenth type;

wherein if the programmable frequency divider comprising a plurality of cells of the tenth type, the cells of the tenth type being cascaded with each other and each cell of the tenth type, the first output node (Fo) being coupled to a first input node (Fi) of a subsequent cell of the tenth type, the second input node (Mi) being coupled to a second output node (Mo) of the subsequent cell of the tenth type; the programmable frequency divider selectively switches each cell to a divide-by-two or a divide-by-three mode according to the respective divisor signal, the reload signal triggers the third input node (Di) of the cell of the eleventh type to reload the corresponding divisor signal, if the last divisor signal received in the fifth input node (Ci) of the cell of the eleven type is at a bypass-mode active state, the cell of the eleventh type switches to a bypass mode, and the second output node (Mo) or the first output node (Fo) of the last cell of the tenth type outputs the result signal having the divided frequency; the cell of the eleventh type operates such that:

(a) regardless of the logic level of the second input node (Mi) or the second output node (Mo), if the first output node (Fo) is at logic 0 and the third input node (Di) is at logic 0 when the fourth input node (Rl) is triggered by the reload signal, the positive edge of a clock signal of the first input node (Fi) triggers the first output node (Fo) to output a half frequency signal;

(b) if the first output node (Fo) is at logic 0, the second input node (Mi) is at logic 1 (or if the second output node (Mo) is at logic 1), and the third input node (Di)

is at logic 1 when the fourth input node (Rl) is triggered by the reload signal, the positive edge of a clock signal of the first input node (Fi) triggers the first output node (Fo) to output a one-third-frequency signal;

(c) if the first output node (Fo) is at logic 0, the second output node (Mo) outputs a signal at the same logic level as the second input node (Mi);

(d) regardless of the logic level of the second input node (Mi), if the first output node (Fo) is at logic 1, the second output node (Mo) outputs a logic 0 signal; and (e) if the signal received on the fifth input node (Ci) is at an active state, the first output node (Fo) outputs a logic 0 signal and the second output node (Mo) outputs a logic 1 signal.

45. A programmable frequency divider for dividing frequency of a source signal according to a selectable divisor which is obtained based on a plurality of divisor signals and outputting a result signal having a divided frequency, the programmable frequency divider comprising:

at least one cell of a tenth type being switchable between divide-by-two and divide-by-three modes having a first input node (Fi), a second input node (Mi), a third input node (Di), a first output node (Fo), and a second output node (Mo), the third input node (Di) being used for receiving a corresponding divisor signal, and the first input node (Fi) of a first cell of the tenth type being coupled to the source signal; and a cell of an eleventh type having a first input node (Fi), a second input node (Mi), a third input node (Di), a fourth input node (Rl), a fifth input node (Ci), a first output node (Fo), a second output node (Mo), and a third output node (Co), the first input node (Fi) being coupled to a first output node (Fo) of a last cell of the tenth type, the second input node (Mi) being set to logic 1, the third input node (Di) being used for receiving a corresponding divisor signal, the fourth input node (Rl) being used for receiving a reload signal to synchronously reload the corresponding divisor signal to the third input node (Di), the fifth input node (Ci) being coupled to a last divisor signal, the second output node (Mo) being coupled to a second input node (Mi) of the last cell of the tenth type; and the fourth input node (Rl)is being coupled to the second output node (Mo) of the last cell of the tenth type in order to apply the result signal to be the reload signal;

wherein if the programmable frequency divider comprising a plurality of cells of the tenth type, the cells of the tenth type being cascaded with each other and each cell of the tenth type, the first output node (Fo) being coupled to a first input node (Fi) of a subsequent cell of the tenth type, the second input node (Mi) being coupled to a second output node (Mo) of the subsequent cell of the tenth type; the programmable frequency divider selectively switches each cell to a divide-by-two or a divide-by-three mode according to the respective divisor signal, the reload signal triggers the third input node (Di) of the cell of the eleventh type to reload the corresponding divisor signal, if the last divisor signal received in the fifth input node (Ci) of the cell of the eleven type is at a bypass-mode active state, the cell of the eleventh type switches to a bypass mode, and the second output node (Mo) or the first output node (Fo) of the last cell of the tenth type outputs the result signal having the divided frequency.

46. The programmable frequency divider of claim 45, further comprising:

at least one cell of a twelfth type being cascaded between at least one cell of the tenth type and the cell of the eleventh type, and each cell of the twelfth type having a first input node (Fi), a second input node (Mi), a third input node (Di), a fourth input node (Rl), a fifth input node (Ci), a first output node (Fo), a second output node (Mo), and a third output node (Go), the first output node (Fo) being coupled to a first input node (Fi) of a subsequent cell of the twelfth type, the second input node (Mi) being coupled to a second output node (Mo) of the subsequent cell, the third input node (Di) being used for receiving a corresponding divisor signal, the fourth input node (Rl) being used for receiving the reload signal to synchronously reload the corresponding divisor signal to the third input node (Di), the fifth input node (Ci) being coupled to a third output node (Go) of the subsequent cell and being used for receiving a bypass-mode enabling signal, a first input node (Fi) of a first cell of the twelfth type being coupled to the first output node (Fo) of the last cell of the tenth type, a second output node (Mo) of the first cell of the twelfth type being coupled to the second input node (Mi) of the last cell of the tenth type, a first output node (Fo) of a last cell of the twelfth type being coupled to the first input node (Fi) of the cell of the eleventh type, and a second input node (Mi) of the last cell of the twelfth type being coupled to the second output node (Mo) of the cell of the eleventh type;

wherein the reload signal triggers each cell of the twelfth type to synchronously reload the corresponding divisor signal to the third input node (Di), each cell of the twelfth type switches to a divide-by-two or divide-by-three mode according to the loaded divisor signal, and if the bypass-mode enabling signal received on the fifth input node (Ci) is at an active state, the cell of the twelfth type switches to a bypass mode.

47. The programmable frequency divider of claim 46, wherein each cell of the twelfth type operates such that:

(a) regardless of the logic level of the second input node (Mi) or the second output node (Mo), if the first output node (Fo) is at logic 0 and the third input node (Di) is at logic 0 when the fourth input node (Rl) is triggered by the reload signal, the positive edge of a clock signal of the first input node (Fi) triggers the first output node (Fo) to output a half frequency signal;

(b) if the first output node (Fo) is at logic 0, the second input node (Mi) is at logic 1 (or if the second output node (Mo) is at logic 1), and the third input node (Di) is at logic 1 when the fourth input node (Rl) is triggered by the reload signal, the positive edge of the clock signal of the first input node (Fi) triggers the first output node (Fo) to output a one-third-frequency signal;

(c) if the first output node (Fo) is at logic 0, the second output node (Mo) outputs a signal at the same logic level as the second input node (Mi);

(d) regardless of the logic level of the second input node (Mi), if the first output node (Fo) is at logic 1, the second output node (Mo) outputs a logic 0 signal; and (e) if the bypass-mode enabling signal received on the fifth input node (Ci) is at an active state, the first output node (Fo) outputs a logic 0 signal and the second output node (Mo) outputs a logic 1 signal.

48. The programmable frequency divider of claim 46, wherein the fourth input node (Rl) of each cell of the twelfth type is coupled to the second output node (Mo) of the last cell of the tenth type in order to apply the result signal to be the reload signal.

* * * * *